(12) United States Patent
Kobayashi

(10) Patent No.: US 6,504,773 B2
(45) Date of Patent: Jan. 7, 2003

(54) MEMORY TESTING METHOD AND MEMORY TESTING APPARATUS

(75) Inventor: Shinichi Kobayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/952,804

(22) Filed: Sep. 13, 2001

(65) Prior Publication Data

US 2002/0031026 A1 Mar. 14, 2002

(30) Foreign Application Priority Data

Sep. 13, 2000 (JP) .................................... 2000-277908

(51) Int. Cl.$^7$ ................................................ G11C 7/00
(52) U.S. Cl. .................. 365/201; 365/195; 365/230.03; 714/718
(58) Field of Search ............................ 365/201, 230.03, 365/230.06, 236, 218, 221, 239, 195; 714/718, 719, 738

(56) References Cited

U.S. PATENT DOCUMENTS 5,646,948 A * 7/1997 Kobayashi et al. ......... 714/719
5,936,901 A * 8/1999 Wong et al. ................. 365/201
5,964,894 A * 10/1999 Kurihara ..................... 714/738
6,415,399 B1 * 7/2002 Yamaoka ..................... 365/201
6,421,773 B1 * 7/2002 Inagaki ....................... 712/234

* cited by examiner

Primary Examiner—David Nelms
Assistant Examiner—Gene N. Auduong
(74) Attorney, Agent, or Firm—David N. Lathrop, Esq.; Gallagher & Lathrop

(57) ABSTRACT

A memory testing method and apparatus each capable of performing an erase test for a non-volatile memory in a short time are provided.

In case of carrying out an erase test inspecting as to whether the storage data in each of the memory cells in a block to be tested of a non-volatile memory has been erased or not by an erasing operation, there are provided two failure address storage memories each storing therein addresses of failure memory cells. These failure address storage memories are alternately used to store therein only addresses of failure memory cells detected during the erase test. In the second time and the succeeding erase tests, the addresses of the failure memory cells stored in either one of the failure address storage memories in the preceding erase test are read out to access only the failure memory cells in the memory under test, thereby to inspect as to whether the storage data in each of the failure memory cells has been erased or not.

6 Claims, 12 Drawing Sheets

RESULT OF THIRD TIME ERASE TEST

RESULT OF SECOND TIME ERASE TEST

RESULT OF FIRST TIME ERASE TEST

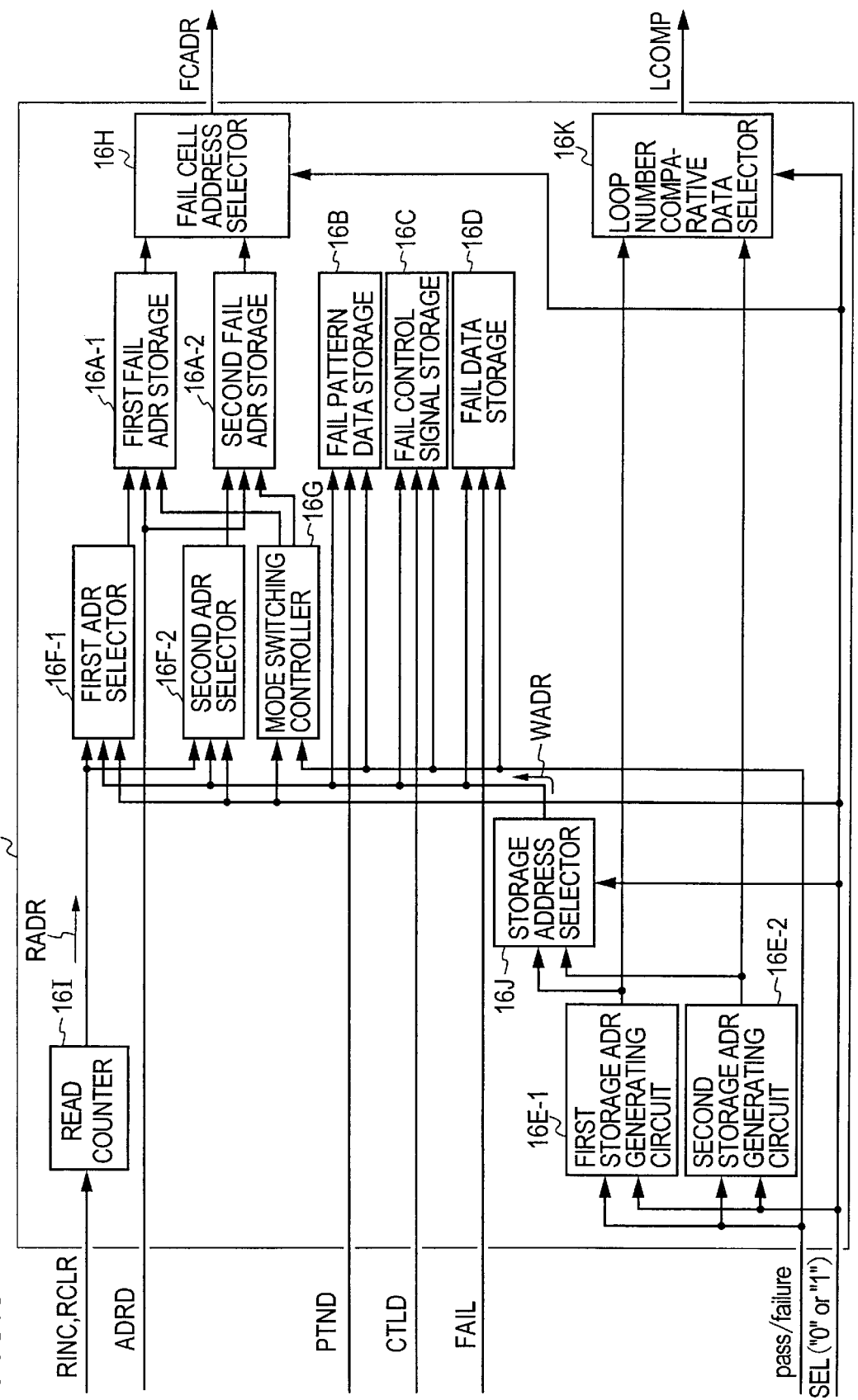

FIG.4 A

FAIL CELL DATA STORED BY FIRST ERASE TEST

| ADDRESS GENERATED BY 16E-1 | MEMORY 16A-1 CA | MEMORY 16A-1 RA | MEMORY 16A-2 CA | MEMORY 16A-2 RA |
|---|---|---|---|---|
| 0 | 3 | 0 | | |
| 1 | 2 | 1 | | |
| 2 | 7 | 2 | | |
| 3 | 4 | 3 | | |
| 4 | 2 | 4 | | |
| 5 | 4 | 6 | | |
| 6 | 7 | 7 | | |
| ... | ... | ... | ... | ... |

NUMERICAL VALUE HELD BY 16E-1: 7

NUMERICAL VALUE HELD BY 16E-2: 0

FIG.4 B

FAIL CELL DATA STORED BY SECOND ERASE TEST

| ADDRESS GENERATED BY 16E-2 | MEMORY 16A-1 CA | MEMORY 16A-1 RA | MEMORY 16A-2 CA | MEMORY 16A-2 RA |
|---|---|---|---|---|
| 0 | 3 | 0 | 7 | 2 |
| 1 | 2 | 1 | 4 | 3 |
| 2 | 7 | 2 | 7 | 7 |
| | 4 | 3 | | |
| | 2 | 4 | | |
| | 4 | 6 | | |
| | 7 | 7 | | |
| ... | ... | ... | ... | ... |

NUMERICAL VALUE HELD BY 16E-1: 7

NUMERICAL VALUE HELD BY 16E-2: 3

FIG.4 C

FAIL CELL DATA STORED BY THIRD ERASE TEST

| ADDRESS GENERATED BY 16E-1 | MEMORY 16A-1 CA | MEMORY 16A-1 RA | MEMORY 16A-2 CA | MEMORY 16A-2 RA |
|---|---|---|---|---|
| 0 | 7 | 7 | 7 | 2 |
| | | | 4 | 3 |
| | | | 7 | 7 |
| ... | ... | ... | ... | ... |

NUMERICAL VALUE HELD BY 16E-1: 1

NUMERICAL VALUE HELD BY 16E-2: 3

FIG.12
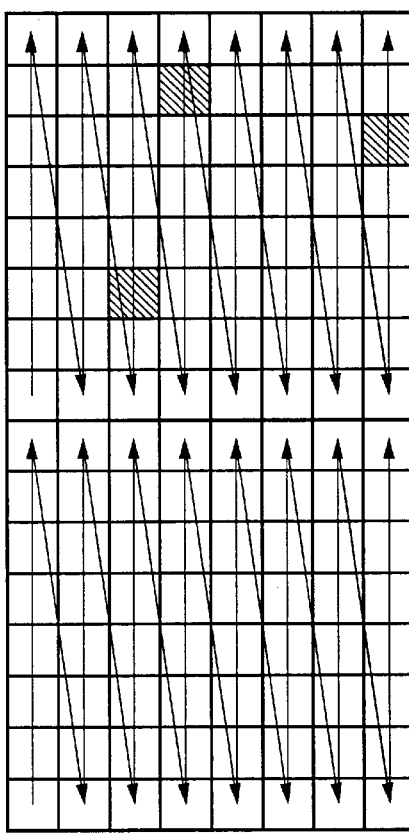

MEMORY TESTING METHOD AND MEMORY TESTING APPARATUS

BACKGROUND OF THE INVENTION

1. Field of the Invention

The present invention relates to a method of testing a non-volatile memory called, for example, flash memory or other non-volatile memory and an apparatus for testing a non-volatile memory used in implementing such memory testing method.

2. Description of the Related Art

A flash memory is a rewritable memory that the stored contents (data) therein is replaceable on the basis of one block by one block by electrically erasing the storage data one block by one block and thereafter, rewriting data therein one block by one block. Heretofore, such non-volatile memories including flash memories have been tested and measured by a memory testing apparatus adapted for testing and measuring commonplace memories (for example, IC memories constituted by semiconductor integrated circuits). FIG. 7 shows, in block diagram, an outline of the construction of a prior typical memory testing apparatus.

The illustrated memory testing apparatus comprises a timing generator 11, a pattern generator 12, a waveform shaping device 13, a logical comparator 14, a failure analysis memory 15 and a failure history storage memory 16. Further, for clarity of explanation, other components and/or circuits of the testing apparatus will not be shown. It is needless to say that the construction of the memory testing apparatus is not limited to such construction as mentioned above.

The pattern generator 12 outputs an address ADRD, a test pattern data PTND, and a control signal CTLD, all of which are to be applied to a memory under test DUT, in accordance with a reference clock CLK supplied to the pattern generator 12 from the timing generator 11. In addition, the pattern generator 12 supplies a reference clock control signal CLKCTLD to the timing generator 11 thereby to control the reference clock generated in the timing generator 11.

The address ADRD, the test pattern data PTND, and the control signal CTLD outputted from the pattern generator 12 are shaped into an address signal ADR, a test pattern signal PTN, and a control signal CTL respectively all of which have their real waveforms in the waveform shaping device 13, and then, they are applied to the memory under test DUT.

In the memory under test DUT, writing and reading the test pattern signal PTN in and from the memory under test are carried out on the basis of the control signal CTL. A response data signal RPS read out of the memory under test DUT is given to the logical comparator 14 where it is compared with an expected value pattern data EXP supplied from the pattern generator 12, thereby to determine whether or not the memory under test DUT has outputted a proper (pass) response data signal.

The logical comparator 14 determines, when the response data signal RPS inputted thereto does not coincide with the expected value pattern data EXP, that a memory cell of the memory under test DUT at the address thereof from which that response data signal RPS has been read out is defective or failure, and generates a decision result of failure "failure" and a failure data FAIL. Usually, when the failure data FAIL is generated, a logical "1" signal being always applied to a data input terminal of the failure analysis memory 15 is enabled to be written in the failure analysis memory 15, and the logical "1" data is written as the failure data FAIL in a memory cell of the failure analysis memory 15 at the address thereof specified by an address ADRD supplied from the pattern generator 12.

In general, the failure analysis memory 15 has the same address space or area as that of the memory under test DUT, and a failure data FAIL (or logical value "1") is stored in the same address of the failure analysis memory 15 as that of the failure memory cell of the memory under test DUT.

On the contrary, when the response data signal RPS from the memory under test DUT coincides with the expected value pattern data EXP from the pattern generator 12, the logical comparator 14 determines that a memory cell of the memory under test DUT at the address thereof from which the response data signal RPS has been read out is a good or defectless (pass) one, and generates a decision result of pass "pass".

In this manner, a determination of pass or failure of the memory under test DUT is carried out in the logical comparator 14. The result of determination of pass or failure "pass/failure" rendered by the logical comparator 14 is supplied to the failure history storage memory 16 and the pattern generator 12. Further, the address of the memory cell of the memory under test DUT that has been determined to be failure will be hereinafter referred to as failure cell address.

In the failure history storage memory 16 are stored an address ADRD, a test pattern data PTND and a control signal CTLD all being generated from the pattern generator 12 when a failure has been generated as well as a failure data FAIL generated from the logical comparator 14.

FIG. 8 is a block diagram showing an example of the internal construction of the pattern generator 12. The pattern generator 12 comprises an address generator 12A, a test pattern data generating part 12B, a control signal generating part 12C, and a sequence controller 12D for controlling the components 12A, 12B 12C.

The sequence, controller 12D comprises an instruction memory 12D-1 in which a series of instructions for pattern generation are previously stored, a program counter 12D-2 for specifying each of addresses of the instruction memory 12D-1, and a program counter controller 12D-3 for controlling the program counter 12D-2 on the basis of data supplied from the instruction memory 12D-1.

In each of the addresses of the instruction memory 12D-1 are previously stored a sequence control instruction, an address operation or computation instruction, a pattern data operation or computation instruction, and a control signal generation instruction. An address outputted from the program counter 12D-2 accesses the corresponding address of the instruction memory 12D-1 so that the storage data in that address is given to the program counter controller 12D-3, the address generator 12A, the pattern data generating part 12B and the control signal generating part 12C.

The program counter controller 12D-3 controls to generate the next address that is outputted from the program counter 12D-2 to the instruction memory 12D-1 in accordance with an instruction given to the controller 12D-3 from the instruction memory 12D-1. The address generator 12A, the pattern data generating part 12B, and the control signal generating part 12C generate an address ADRD, a test pattern data PTND, and a control signal CTLD all of which are to be applied to the memory under test DUT, respectively, in accordance with instructions given to them respectively from the instruction memory 12D-1. In addition, the pattern data generating part 12B also generates an expected value pattern data EXP to be applied to the logical comparator 14 in accordance with an instruction given to the generating part 12B from the instruction memory 12D-1.

FIG. 9 is a block diagram showing an example of the internal construction of the failure history storage memory 16. The failure history storage memory 16 comprises a failure address storage memory 16A for storing therein an address ADRD being outputted from the pattern generator 12 when a decision result of failure "failure" has been generated from the logical comparator 14; a fail pattern data storage memory 16B for storing therein a test pattern data PTND being outputted from the pattern generator 12 when a decision result of failure "failure" has been generated from the logical comparator 14; a fail control signal storage memory 16C for storing therein a control signal CTLD being outputted from the pattern generator 12 when a decision result of failure "failure" has been generated from the logical comparator 14; a fail data storage memory 16D for storing therein a failure data FAIL being generated from the logical comparator 14 when a decision result of failure "failure" has been generated from the logical comparator 14; and a storage address generating circuit 16E for outputting respective addresses of the memories 16A, 16B, 16C and 16D at which these data (signals) are to be stored respectively.

Accordingly, each time the logical comparator 14 renders a decision of failure "failure", an address ADRD, a test pattern data PTND, a control signal CTLD all being outputted from the pattern generator 12 at that time, and a failure data FAIL being outputted from the logical comparator 14 at that time are stored in these failure address storage memory 16A, fail pattern data storage memory 16B, fail control signal storage memory 16C, and fail data storage memory 16D, respectively.

The storage address generating circuit 16B is initialized at the starting time point of a test in the condition that it will output the first address ("0" in this example) of each of the respective storage memories 16A, 16B, 16C, and 16D, and each time the logical comparator 14 renders a decision of failure, the storage address generating circuit 16E increments an address generated thereby by +1, but it generates the first address "0" when the first time decision of failure is rendered. Accordingly, an address, a test pattern data, a control signal all of which are being generated when a decision of failure is rendered, and a failure data to be stored in each of the storage memories 16A, 16B, 16C, and 16D are stored at addresses thereof which are incremented by +1 starting at address 0 in the sequence of address 1, address 2, . . . , each time a decision of failure is rendered.

Now, a method of testing a non-volatile memory using the memory testing apparatus constructed above will be described.

A flash memory generally has its whole storage area divided into a plurality of blocks, and as described above, it is possible to erase the stored data in the storage area one block by one block en bloc. The flash memory has a function that data can be written in the storage area one block by one block and that data can be rewritten in the storage area one block by one block.

At the starting time point of a test, a block to be tested is defined, logical "1" or "0" is written in all of memory cells in the block to be tested, and thereafter, the storage data written in all of the memory cells in the block to be tested are erased en bloc. After such erase process, in order to inspect as to whether the storage data in each of the memory cells has been erased or not, the storage data in all of the memory cells in the block to be tested are read out. As a result of the reading of the storage data, a memory cell that the storage data therein has been erased is determined to be a good or defectless one (pass). The second time erase process is carried out for a memory cell or cells each having the storage data that has not been erased even after the first time erase process (such memory cell will be referred to as failure memory cell, hereinafter), and then, each failure memory cell again undergoes an inspection as to whether the storage data in each failure memory cell has been erased or not. In such manner, a series of operations for erasing the storage data written in all of memory cells in a block to be tested en bloc and inspecting as to whether the storage data in each memory cell has been erased or not, the series of operations being carried out after a logical signal has been written in all of memory cells in the block to be tested, will be referred to as erase test, hereinafter.

When the storage data in all of the memory cells have been erased within a predetermined times of erases, that block is determined to be a good or defectless one (pass). The above-mentioned erase test is repeated for all blocks in sequence, and when all blocks have been determined to be good ones (pass), that non-volatile memory under test has been determined to be a good memory (PASS).

FIG. 10 is a flow chart for explaining the above-mentioned erase test for a non-volatile memory in accordance with the sequence of process steps. First, in the first step SP1, the number of times of erases N is initialized to N=0. In the second step SP2, a block to be tested of the non-volatile memory under test is set, and in the third step SP3, an erasing pattern is applied to the set block to be tested, thereby to erase the storage data in each of all memory cells in the block to be tested. In the fourth step SP4, the number of times of erases N is incremented by +1 so that it becomes one time.

Next, in the fifth step SP5, all of the storage data in all memory cells in the block to be tested have been read out to inspect as to whether the storage data in each memory cell has been erased or not. In case even one memory cell the storage data of which has been not erased (failure memory cell) has been detected during the inspection, the process is branched to failure path "Fail" reaching the sixth step SP6.

In the sixth step SP6, a decision as to whether the number of erase times N is smaller than a prescribed value or not is rendered. If the number of erase times N is smaller than the prescribed value, then the process is branched to YES path returning back to the third step SP3. In the third step SP3, an erasing pattern is again applied to the block to be tested, thereby to repeat the erase test described above.

In the sixth step SP6, if the number of erase times N exceeds the prescribed value, then the process is branched to NO path so that the block to be tested is determined to be failure "FAIL".

In the fifth step SP5, if it is confirmed that all of the storage data in all memory cells in the block to be tested have been erased, the process is branched to good path "Pass" reaching the seventh step SP7. In the seventh step SP7, a decision is rendered as to whether the block to be tested is the last block or not. If it is determined that the block to be tested is the last block, the process is branched to YES path so that it is determined that the non-volatile memory under test is a good memory "PASS". On the other hand, in the seventh step SP7, if it is determined that the block to be tested is not the last block, the process is branched to NO path reaching the eighth step SP8. In the eighth step SP8, a process for proceeding to the next block to be tested (incrementing the block address by +1) is applied to the memory under test, and then the process returns back to the first step SP1.

The details of the decision operations in the erase test performed in the fifth step SP5 will be described with reference to a flow chart shown in FIG. 11.

First, in a step SP5-1, the first address of the block to be tested is loaded. In a step SP5-2, a decision is rendered as to whether the storage data in the memory cell at the address to be tested (the first address) has been erased or not. If not erased (Fail), the process is branched to a step SP5-3 in which one (1) is set in a failure flag. Thereafter, in a step SP5-4, a failure data "FAIL" is stored in the failure analysis memory 15 and the failure history storage memory 16, and then the process proceeds to a step SP5-5. In the step SP5-5, a decision is rendered as to whether the address to be tested is the last address or not. If the address to be tested is not the last address (NO), the process is branched to a step SP5-6 in which the address to be tested is incremented by +1. Thereafter, the process returns back to the step SP5-2.

In the step SP5-5, if it is determined that the address to be tested is the last address (YES), the process is branched to a step SP5-7. In the step SP5-7, a decision is rendered as to whether the failure flag has been 1 or not. If the failure flag has not been 1, the process is branched to NO path so that the block to be tested is determined to be a good block (pass), and then, the process proceeds to the seventh step SP7 in FIG. 10. If it is determined that the failure flag has been 1, the process is branched to YES path so that the block to be tested is determined to be a failure block (Fail), and then, the process proceeds to the sixth step SP6 in FIG. 10.

FIG. 12 shows a case of the prior art in which each of the blocks in the non-volatile memory under test has eight column addresses CA of 0 to 7 and eight row addresses RA of 0 to 7, and address signals are sequentially generated as shown by arrows, that is, the address signals are generated starting at the first column address CA (0) and the first row address RA (0) through CA and RA addresses (1, 0), (2, 0), (3, 0), . . . , to (7, 0) in the column address direction, proceeding to the second RA address (1), starting at the first CA (0) and the second RA (1) through CA and RA addresses (1, 1), (2, 1), (3, 1), . . . , to (7, 1) in the column address direction, proceeding to the third RA address (2), . . . , until the last CA and RA address (7, 7) in the same sequence, and when the address signal of the last CA and RA address (7, 7) is generated, generation of the address signals is ended so that all addresses in the block to be tested are accessed.

In the erase test of the prior art described above, each time the erase test is carried out for a block to be tested, all of the memory cells in that block to be tested are always accessed irrespective of the number of times of the erase tests, that is, even though the number of the erase test times for the block is two or more, all of the memory cells in that block to be tested are always accessed. By way of example, in the block 2 shown in FIG. 12, even if a decision is rendered in the first time erase test that the storage data in the memory cells at CA and RA addresses (2, 2), (6, 3) and (5, 7) shown by oblique lines are not erased (namely, these memory cells are failure cells), all of the addresses including the addresses that have been determined to be good cells (pass) in the first time erase test are sequentially generated in the second time erase test, and the storage data in all of the memory cells in the block 2 to be tested are read out, thereby to check as to whether each of the read-out memory cells is a good one (pass) or not. In addition, in this second time erase test, if the memory cells at CA and RA addresses (2, 2), (6, 3) and (5, 7) or any one of them is determined to be failure, the third time erase test is carried out, and all of the addresses are sequentially generated again in the third time erase test, and the storage data in all of the memory cells in the block 2 to be tested are read out, thereby to check as to whether each of the read-out memory cells is pass or failure. Thereafter, as far as any failure memory cell is detected, the prescribed number of times of the erase tests will be carried out in the same manner.

For this reason, notwithstanding a small failure memory cells, a lot of time is spent in determining as to whether each of the memory cells is pass or failure, and hence there is a disadvantage that a time duration required to carry out the erase test for each block becomes long. In case of the non-volatile memory shown in FIG. 12, for clarity of explanation, it is assumed that each of the blocks is constituted by 8 bits×8 bits. However, in practical, there are cases that the memory cells in one block are constituted by several kilobits. Accordingly, a time duration required to carry out the erase test for such block becomes long more and more.

Moreover, in case a plurality of non-volatile memories are simultaneously tested, even if there exists only one non-volatile memory having its block containing one or more failure addresses, the erase test for this non-volatile memory is repeated by a prescribed number of times as far as one or more failure memory cells are detected. As a result, the remaining non-volatile memories must await until the erase test for the non-volatile memory having its block containing one or more failure addresses has been completed, notwithstanding that the erase test for each of the remaining non-volatile memories has been completed only once. Consequently, there occurs a serious drawback that the remaining non-volatile memories spend a waste of time, which results in longer test time.

In recent years, in order to reduce a testing cost, many semiconductor memory testing apparatus each being able to test and measure a multiplicity of (for example, 64) semi-conductor memories at the same time have appeared, and when many non-volatile memories are simultaneously tested by such a semiconductor memory testing apparatus, there is a strong possibility that at least one non-volatile memory among them has its block including one or more failure addresses. Accordingly, the aforesaid drawback resulting in longer test time eventually brings about an increase of the testing cost.

SUMMARY OF THE INVENTION

It is an object of the present invention to provide a memory testing method and a memory testing apparatus each being capable of carry out the erase test for a non-volatile memory at high speed.

It is another object of the present invention to provide a memory testing method and a memory testing apparatus each being capable of reading out only a failure memory cell or cells in the second time and the succeeding erase tests, and inspecting as to whether the storage data in the read-out memory cell or each of the read-out memory cells has been erased.

In order to accomplish the above objects, in a first aspect of the present invention, there is provided a memory testing method wherein after data has been written in all of the memory cells in one block to be tested of a memory having its storage area divided into a plurality of blocks, an erase test has been carried out which comprises the steps of: erasing en bloc the storage data written in all of the memory cells in the block to be tested; and inspecting as to whether the storage data in each of the memory cells has been erased or not, the method comprising the steps of: in the first time erase test, sequentially reading out all of the memory cells in the block to be tested that have been erased en bloc, inspecting as to whether the storage data in each of the memory cells has been erased or not, and storing, when a failure memory cell the storage data of which has not been erased has been detected, the address of the failure memory cell; and in the second time and the succeeding erase tests in case a failure memory cell or cells have been detected, reading out only the failure memory cell or cells in the block to be tested, the address or addresses of the failure memory cell or cells having been stored, and inspecting as to whether the storage data in the failure memory cell or each of the failure memory cells has been erased or not.

In a preferred embodiment, the aforesaid memory testing method further comprises the step of determining, in case no failure memory cell has detected from the block to be tested by carrying out the erase test a plurality of times smaller than or equal to a prescribed number of times, the block to be tested to be one which has no failure memory cell, and determining, in case a failure memory cell has been still detected from the block to be tested by carrying out the erase test repetitively even the prescribed number of times, the block to be tested to be failure.

In addition, the aforesaid memory testing method further comprises the step of rendering a decision as to whether the block to be tested that has been determined to have no failure memory cell is the last block or not, and when the block to be tested is not the last block, carrying out the erase test for the next block, and when the block to be tested is the last block, rendering a decision that the memory is pass.

In a second aspect of the present invention, there is provided a memory testing apparatus comprising: an address generator generating block addresses each specifying each block of a memory under test having its storage area divided into a plurality of blocks, and all addresses of the memory cells in each block; a first failure address storage memory storing, each time a failure memory cell the storage data of which has not been erased is detected, during a erase test inspecting as to whether the storage data in each of the memory cells in a block to be tested specified by a block address generated from the address generator has been erased or not, the address of the failure memory cell, the stored failure memory cell address or addresses being read out from the first failure address storage memory in case the next erase test is carried out; a second failure address storage memory storing, each time a failure memory cell the storage data of which has not been erased is detected, during the erase test is being carried out by reading out the failure memory cell or cells stored in the first failure address storage memory, the address of the failure memory cell, the stored failure memory cell address or addresses being read out from the second failure address storage memory in case the next erase test is carried out; controller alternately switching the first failure address storage memory and the second failure address storage memory to the writing mode and the reading mode; counting means counting the number of times of data erases performed for the block to be tested; and pass/failure decision means comparing the count value counted by the counting means with a predetermined set value, and rendering a decision as to whether the data in all of the memory cells in the block to be tested have been erased or not within a predetermined number of erase times.

In a preferred embodiment, the aforesaid memory testing apparatus further comprises: a first storage address generating circuit applying a storage address to the first failure address storage memory set in the writing mode, said storage address specifying an address of the first failure address storage memory at which the address of the detected failure memory cell is stored; a second storage address generating circuit applying a storage address to the second failure address storage memory set in the writing mode, said storage address specifying an address of the second failure address storage memory at which the address of the detected failure memory cell is stored; and a read counter applying a reading address to the first failure address storage memory set in the reading mode or the second failure address storage memory set in the reading mode, said reading address specifying the address of the first failure address storage memory or the second failure address storage memory, at which the address of the failure memory cell is stored.

In addition, the aforesaid memory testing apparatus further comprises: a storage means temporarily storing the address of the failure memory cell read out from the first failure address storage memory set in the reading mode or the second failure address storage memory set in the reading mode.

With the memory testing method and the memory testing apparatus according to the present invention, in the second time and the succeeding erase tests, only failure memory cells are read out, and a decision is rendered as to whether each of the storage data in the failure memory cells has been erased or not. Therefore, a time duration required to inspect the memory cells is largely reduced in case the number of the failure memory cells is small, and a time duration required to test a non-volatile memory can be greatly reduced.

BRIEF DESCRIPTION OF THE DRAWINGS

FIG. 3 is a block diagram showing a construction of the failure history storage memory which is a principal portion of one embodiment of the memory testing apparatus according to the present invention used in implementing the memory testing method explained in FIG. 1;

FIGS. 4A–4C is diagrams for explaining the operation of the failure history storage memory shown in FIG. 3;

FIG. 12 is diagrams for explaining the prior memory testing method.

DETAILED DESCRIPTION OF THE PREFERRED EMBODIMENTS

Now, the preferred embodiments of the present invention will be described in detail with reference to FIGS. 1 to 6. The present invention may, however, be embodied in many different forms and should not be construed as limited to the embodiments set forth hereinafter; rather, the embodiments are provided so that this disclosure will be thorough and complete, and will fully convey the scope of the invention to those skilled in the art.

Figure 1:
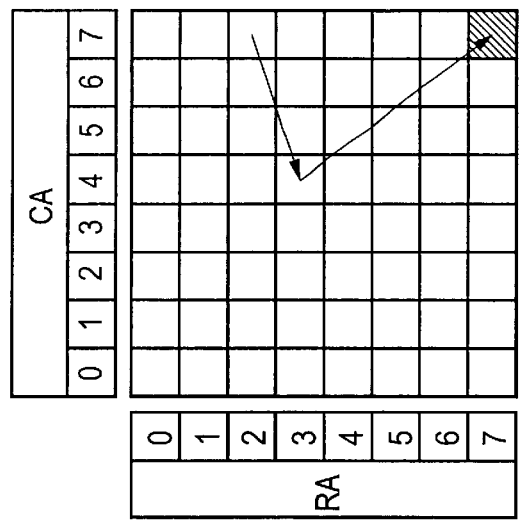
FIGS. 1A–1C is diagrams for explaining an embodiment of the memory testing method according to the present invention.
Figure 1:
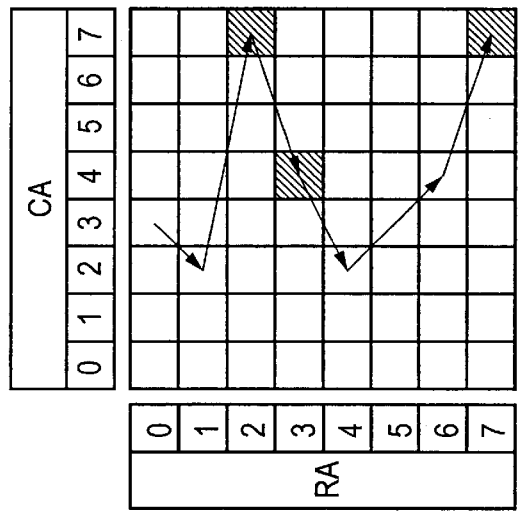
Figure 1:
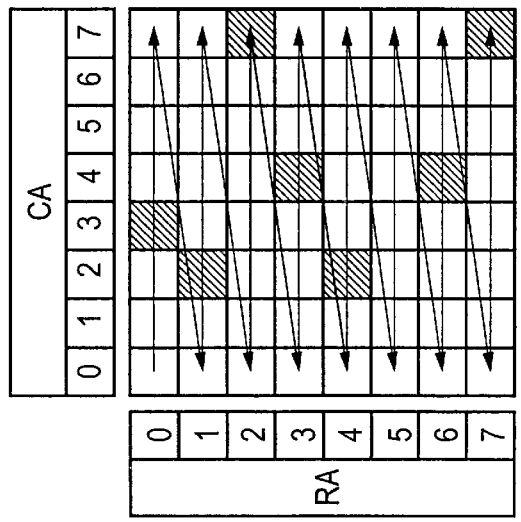

At first, one embodiment of the memory testing method according to the present invention will be described with reference to FIG. 1. FIGS. 1A, 1B and 1C show states that in case one block to be tested in a nonvolatile memory has undergone the erase test, the number of failure memory cells in this block to be tested decreases step by step each time the erase test for the block to be tested is repeated. Further, it is assumed that each of the blocks in this non-volatile memory has eight column addresses CA of 0 to 7 and eight row addresses RA of 0 to 7, as in the prior art shown in FIG. 12.

FIG. 1A shows one example of the result of the first time erase test for a non-volatile memory, and the first time inspecting process. As a result of the first time erase test, each of the memory cells the storage data of which have been erased is shown by a blank box, and each of the memory cells the storage data of which have not been erased, that is, have remained as they are, is shown by a box having oblique lines. In this example, a case is shown, as a result of the first time erase test, that the storage data in seven memory cells at their column addresses CA and row addresses RA (3, 0), (2, 1), (7, 2), (4, 3), (2, 4), (4, 6), and (7, 7) have not been erased and have remained as they are, and hence they have been determined to be failure memory cells (hereinafter, failure memory cell will be referred to as failure cell).

In order to detect whether a failure cell exists in a block to be tested, in the first time erase test, after an erasing pattern has been applied to the block to be tested in a non-volatile memory under test, address signals are sequentially generated, as shown in FIG. 1A by arrows in this embodiment, too, starting at the first column address CA (0) and the first row address RA (0) through CA and RA addresses (1, 0), (2, 0), (3, 0), . . . , to (7, 0) in the column address direction, proceeding to the second RA address (1), starting at the first CA (0) and the second RA (1) through CA and RA addresses (1, 1), (2, 1), (3, 1), . . . , to (7, 1) in the column address direction, proceeding to the third RA address (2), . . . , until the last CA and RA address (7, 7) in the same sequence, and when the address signal of the last CA and RA address (7, 7) is generated, generation of the address signals is ended so that the storage data of all the memory cells in the block to be tested are read out, and an inspection as to whether each of the storage data has been erased or not is sequentially carried out.

FIG. 1B shows one example of the result of the second time erase test, and the second time inspecting process. In this embodiment, the second time erase test is performed such that only CA and RA addresses (3, 0), (2, 1), (7, 2), (4, 3), (2, 4), (4, 6), and (7, 7) of seven failure cells the storage data of which have not been erased as a result of the first time erase test, have been accessed to read out their storage data, thereby to inspect as to whether each of the storage data has been erased or not. As a result of this second time erase test, the illustrated example in FIG. 1B shows that the failure cells having existed at the CA and RA addresses (3, 0), (2, 1), (2, 4), and (4, 6) have been erased in their storage data.

FIG. 1C shows one example of the result of the third time erase test, and the third time inspecting process. In this embodiment, the third time erase test is performed such that only CA and RA addresses (7, 2), (4, 3), and (7, 7) of three failure cells that have been determined to be failure cells as a result of the second time erase test, have been accessed to read out their storage data, thereby to inspect as to whether each of the storage data has been erased or not. As a result of this third time erase test, the illustrated example in FIG. 1C shows that the failure cells having existed at the CA and RA addresses (7, 2), and (4, 3) have been erased in their storage data and that the remaining failure cells becomes only the memory cell at the CA and RA address (7, 7).

In this manner, in the first embodiment of the memory testing method according to the present invention, since the second time and the succeeding erase tests are performed such that only failure cells that have been determined to be failure cells as a result of the preceding erase test, have been accessed, thereby to inspect as to whether each of the storage data has been erased or not, a time duration required to read out the memory cells can be greatly reduced, as compared with the prior art inspection process already discussed in which all of the memory cells in a block to be tested have always accessed each time the erase test has been performed. As a result, there is obtained an advantage that a time duration required to carry out the erase test for a non-volatile memory can be considerably shortened.

FIGS. 2 and 3 are block diagrams showing constructions of the principal portions of one embodiment of the memory testing apparatus according to the present invention used in implementing the memory testing method according to the present invention described above with reference to FIG. 1, and FIG. 2 shows an embodiment of the pattern generator FIG. 3 shows an embodiment of the failure history storage. Further, portions or components in FIGS. 2 and 3 corresponding to those in FIGS. 8 and 9 will be denoted by the same reference characters affixed thereto, and the explanation thereof will be omitted unless it is necessary.

Figure 2:
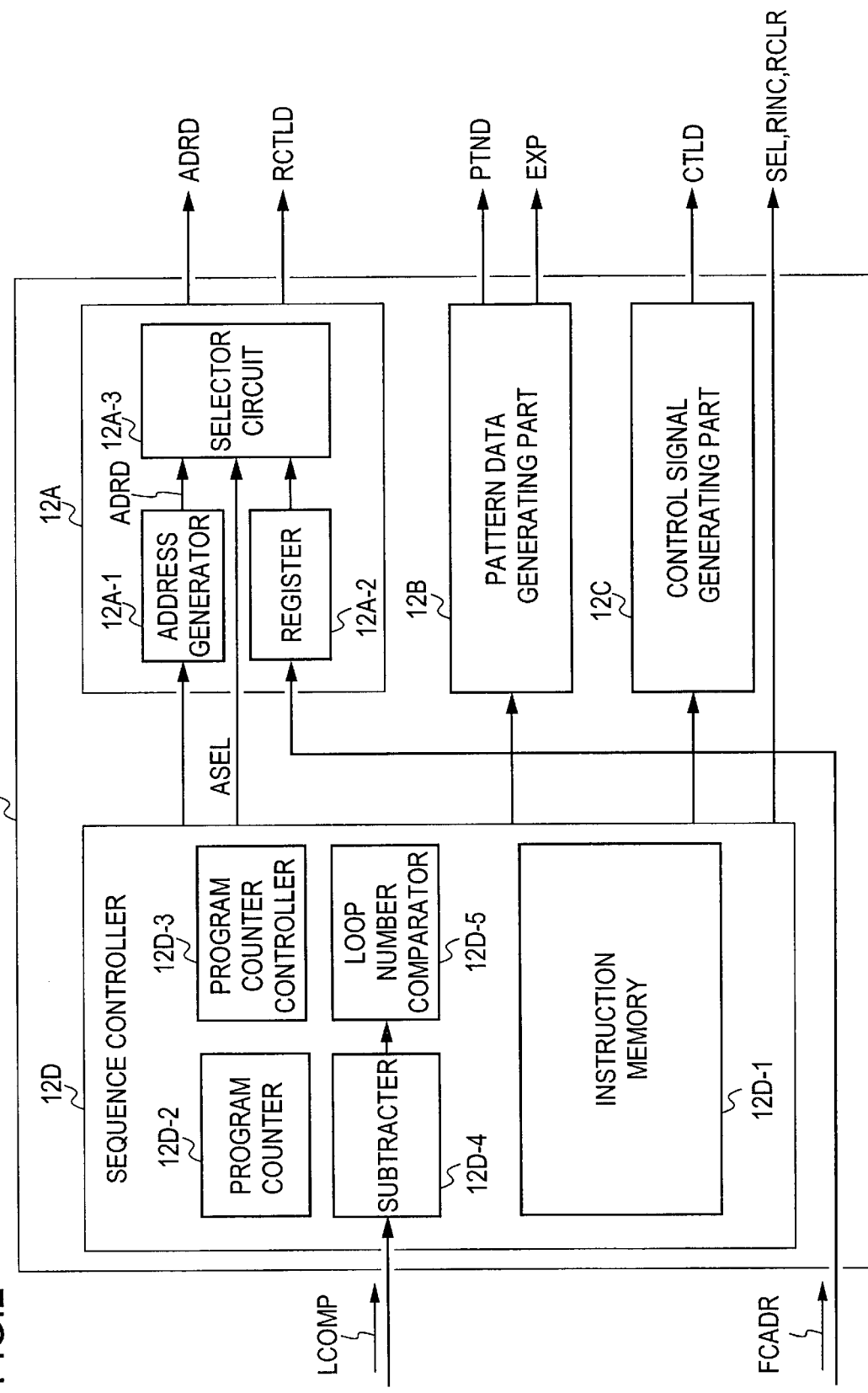
FIG. 2 is a block diagram showing a construction of the pattern generator which is a principal portion of one embodiment of the memory testing apparatus according to the present invention used in implementing the memory testing method explained in FIG. 1.
Figure 8:
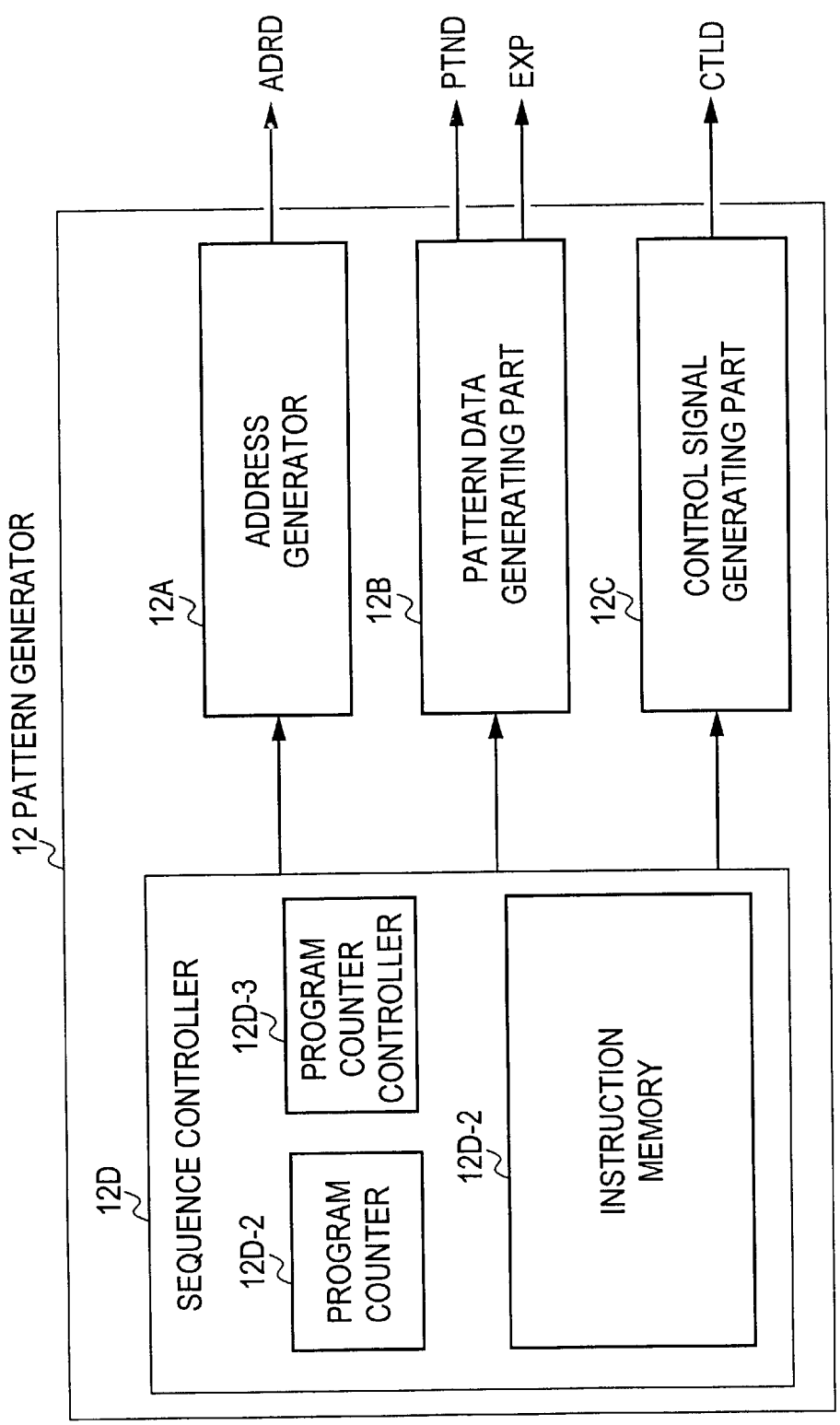
FIG. 8 is a block diagram showing a construction of the pattern generator used in the memory testing apparatus shown in FIG. 7.

In order to implement the memory testing method according to the present invention, in this embodiment, as shown in FIG. 2, an address generating part 12A of a pattern generator 12 comprises a register 12A-2 and a selector circuit 12A-3 provided therein, in addition to an intrinsic address generator 12A-1 (address generator corresponding to the address generator 12A of the prior art shown in FIG. 8). The register 12A-2 stores a failure cell address FCADR sent from the failure history storage memory 16 shown in FIG. 3 and loaded thereinto. The selector circuit 12A-3 selects either one of an address ADRD outputted from the address generator 12A-1 and a failure cell address FCADR stored in the register 12A-2.

The selector circuit 12A-3 is controlled in its operation by a logical value of a control signal ASEL outputted from a sequence controller 12D. In this embodiment, in case the control signal ASEL has a logical value "1", the selector circuit 12A-3 selects the register 12A-2 and outputs a failure cell address FCADR stored in the register 12A-2 as an address ADRD to be applied to a memory under test. In case the control signal ASEL has a logical value "0", the selector circuit 12A-3 selects the address generator 12A-1 and outputs an address outputted from the address generator 12A-1 as an address ADRD to be applied to a memory under test.

Moreover, the sequence controller 12D has a subtracter 12D-4 and a loop number comparator circuit 12D-5 provided therein. The subtracter 12D-4 subtracts one (1) from a loop number comparative data LCOMP sent from the failure history storage memory 16 shown in FIG. 3 to input the difference or remainder (comparative data) into the loop number comparator circuit 12D-5.

The loop number comparator circuit 12D-5 compares the number of occurrence of loop instructions (instruction to loop addresses of detected failure cells) outputted from the sequence controller 12D with the comparative data given from the subtracter 12D-4, and outputs a logical "1" signal when the number of occurrence of loop instructions coincides with the comparative data, thereby to transfer the control condition of the sequence controller 12D to the next condition. Further, a pattern data generating part 12B, a control signal generating part 12C and an instruction memory 12D-1 may be the same components as the pattern data generating part 12B, the control signal generating part 12C and the instruction memory 12D-1 of the prior art shown in FIG. 8.

Figure 9:
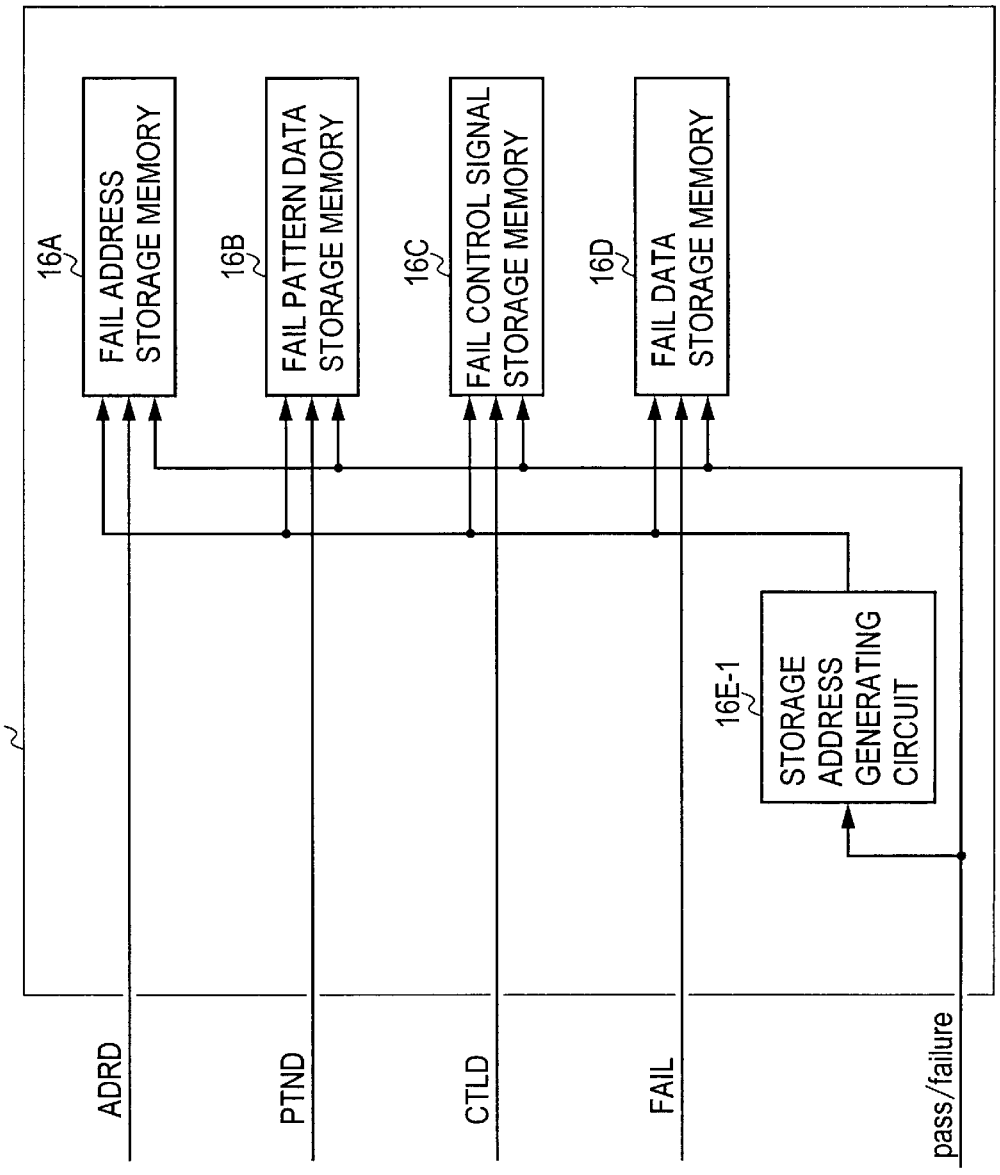
FIG. 9 is a block diagram showing a construction of the failure history storage memory used in the memory testing apparatus shown in FIG. 7.
Figure 10:
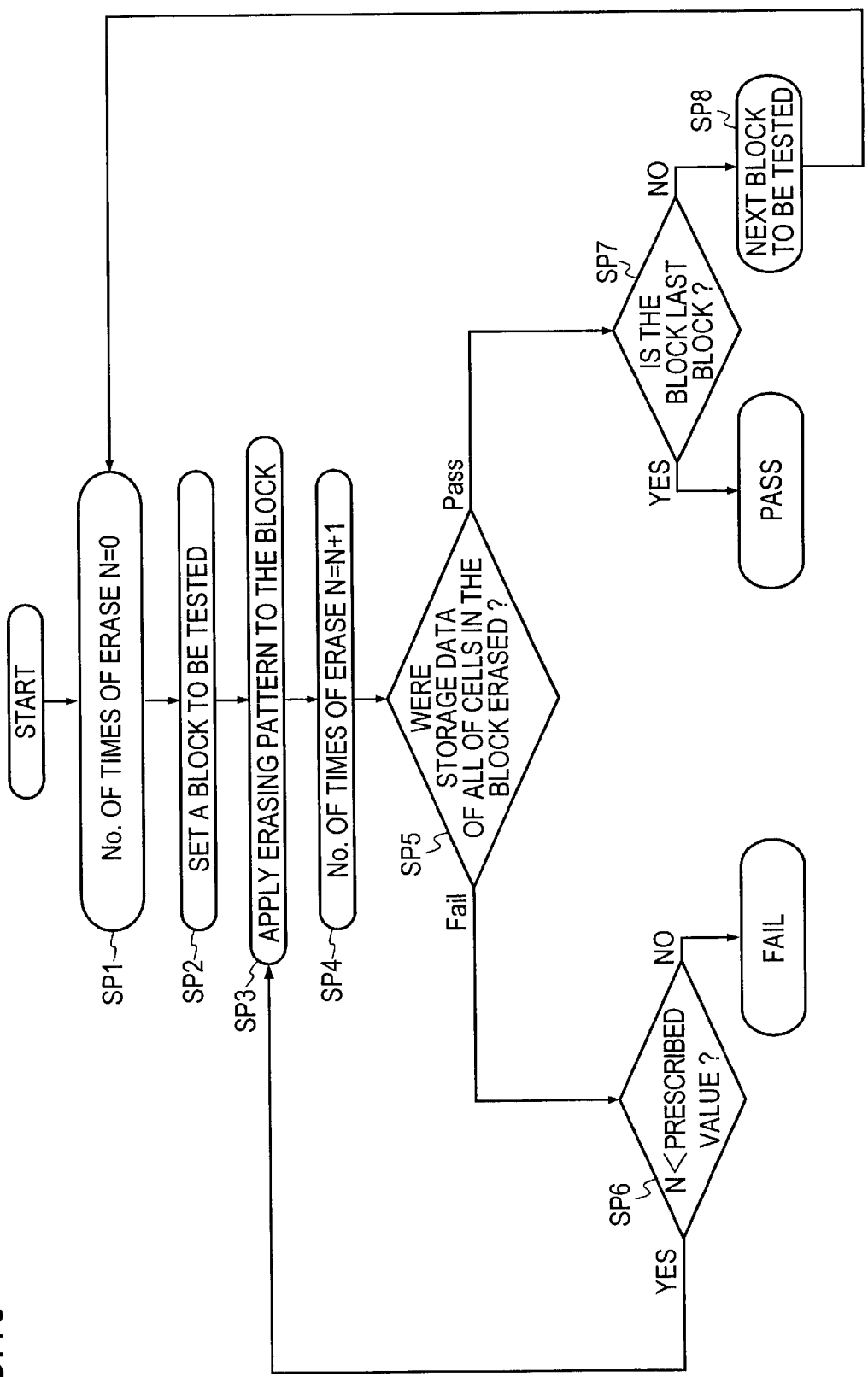
FIG. 10 is a flow chart for explaining the operation of a prior memory testing method.
Figure 11:
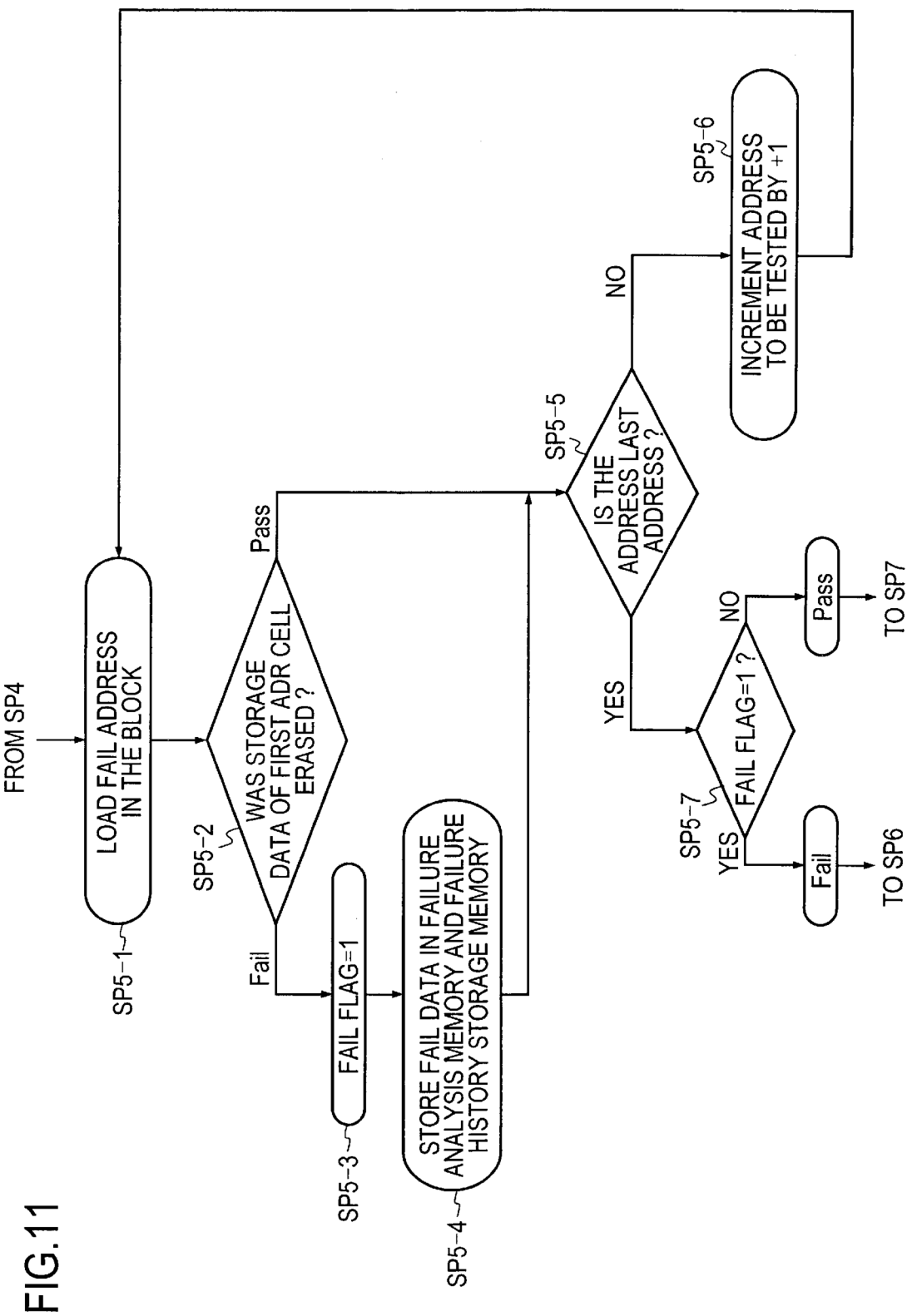
FIG. 11 is a flow chart for explaining in detail a portion of the flow chart shown in FIG. 10.

On the other hand, as shown in FIG. 3, the failure history storage memory 16 comprises, in addition to the fail pattern data storage memory 16B, the fail control signal storage memory 16C and the fail data storage memory 16D all used in the prior art shown in FIG. 9, first and second two failure address storage memories 16A-1 and 16A-2; first and second two storage address generating circuits 16E-1 and 16E-2; a first address selector circuit 16F-1 for selectively supplying a storage address (writing address) WADR or a reading address RADR to the first failure address storage memory 16A-1; a second address selector circuit 16F-2 for selectively supplying a storage address (writing address) WADR or a reading address RADR to the second failure address storage memory 16A-2; a mode switching controller 16G for alternately switching the first failure address storage memory 16A-1 in a writing mode and a reading mode and the second failure address storage memory 16A-2 in the reading mode and the writing mode; a failure cell address selector circuit 16H for selectively reading out a failure cell address ADRD stored in the first failure address storage memory 16A-1 or the second failure address storage memory 16A-2 and giving the read-out failure cell address ADRD to the pattern generator 12 shown in FIG. 2; a read counter 161 for selectively giving a reading address RADR to the first failure address storage memory 16A-1 or the second failure address storage memory 16A-2; a storage address selector circuit 16J for selecting to input a storage address WADR generated in the first storage address generating circuit 16E-1 into the first failure address storage memory 16A-1, the fail pattern data storage memory 16B, the fail control signal storage memory 16C and the fail data storage memory 16D or to input a storage address WADR generated in the second storage address generating circuit 16E-2 into the second failure address storage memory 16A-2, the fail pattern data storage memory 16B, the fail control signal storage memory 16C and the fail data storage memory 16D; and a loop number comparative data selector circuit 16K for selectively giving the number of storage addresses WADR generated in the first storage address generating circuit 16E-1 or generated in the second storage address generating circuit 16E-2 to the subtrcter 12D-4 of the pattern generator 12 shown in FIG. 2 as a loop number comparative data LCOMP.

The storage address selector circuit 16J selects either one of the first storage address generating circuit 16E-1 or the second storage address generating circuit 16E-2 depending upon a control signal SEL given from the sequence controller 12D shown in FIG. 2 thereto. In this embodiment, the storage address selector circuit 16J is arranged such that when the control signal SEL has a logical "0", it selects the first storage address generating circuit 16E-1 and when the control signal SEL has a logical "1", it selects the second storage address generating circuit 16E-2.

The first and second storage address generating circuits 16E-1 and 16E-2 are controlled in the generation of a storage address WADR depending upon a control signal SEL given from the sequence controller 12D. In this embodiment, the first storage address generating circuit 16E-1 generates a storage address WADR when the control signal SEL has a logical "0", and when the control signal SEL becomes a logical "1", it holds the number of storage addresses generated therein. The second storage address generating circuit 16E-2 generates a storage address WADR when the control signal SEL has a logical "1", and when the control signal SEL becomes a logical "0", it holds the number of storage addresses generated therein. The storage addresses WADR generated in the first storage address generating circuit 16E-1 and the second storage address generating circuit 16E-2 are supplied to both the storage address selector circuit 16J and the loop number comparative data selector circuit 16K.

The loop number comparative data selector circuit 16K selects, in this embodiment, the second storage address generating circuit 16E-2 when the control signal SEL given from the sequence controller 12D has a logical "0", and selects the first storage address generating circuit 16E-1 when the control signal SEL has a logical "1" so that it takes therein as a data the number of storage addresses generated in each of the storage address generating circuits.

The mode switching controller 16G alternately switches the first failure address storage memory 16A-1 in the writing mode and the reading mode and the second failure address storage memory 16A-2 in the reading mode and the writing mode. That is, in case the first failure address storage memory 16A-1 is controlled in the writing mode, the second failure address storage memory 16A-2 is controlled in the reading mode.

This mode switching controller 16G is configured, in this embodiment, such that it sets the first failure address storage memory 16A-1 in the writing mode when the control signal SEL given from the sequence controller 12D has a logical "0", thereby to supply a storage address WADR from the first address selector circuit 16F-1 to that storage memory 16A-1 as well as it sets the second failure address storage memory 16A-2 in the reading mode, thereby to supply a reading address RADR from the second address selector circuit 16F-2 to that storage memory 16A-2. On the other hand, the mode switching controller 16G is configured such that it sets the second failure address storage memory 16A-2 in the writing mode when the control signal SEL has a logical "1", thereby to supply a storage address WADR from the second address selector circuit 16F-2 to that storage memory 16A-2 as well as it sets the first failure address storage memory 16A-1 in the reading mode, thereby to supply a reading address RADR from the first address selector circuit 16F-1 to that storage memory 16A-1.

Figure 7:
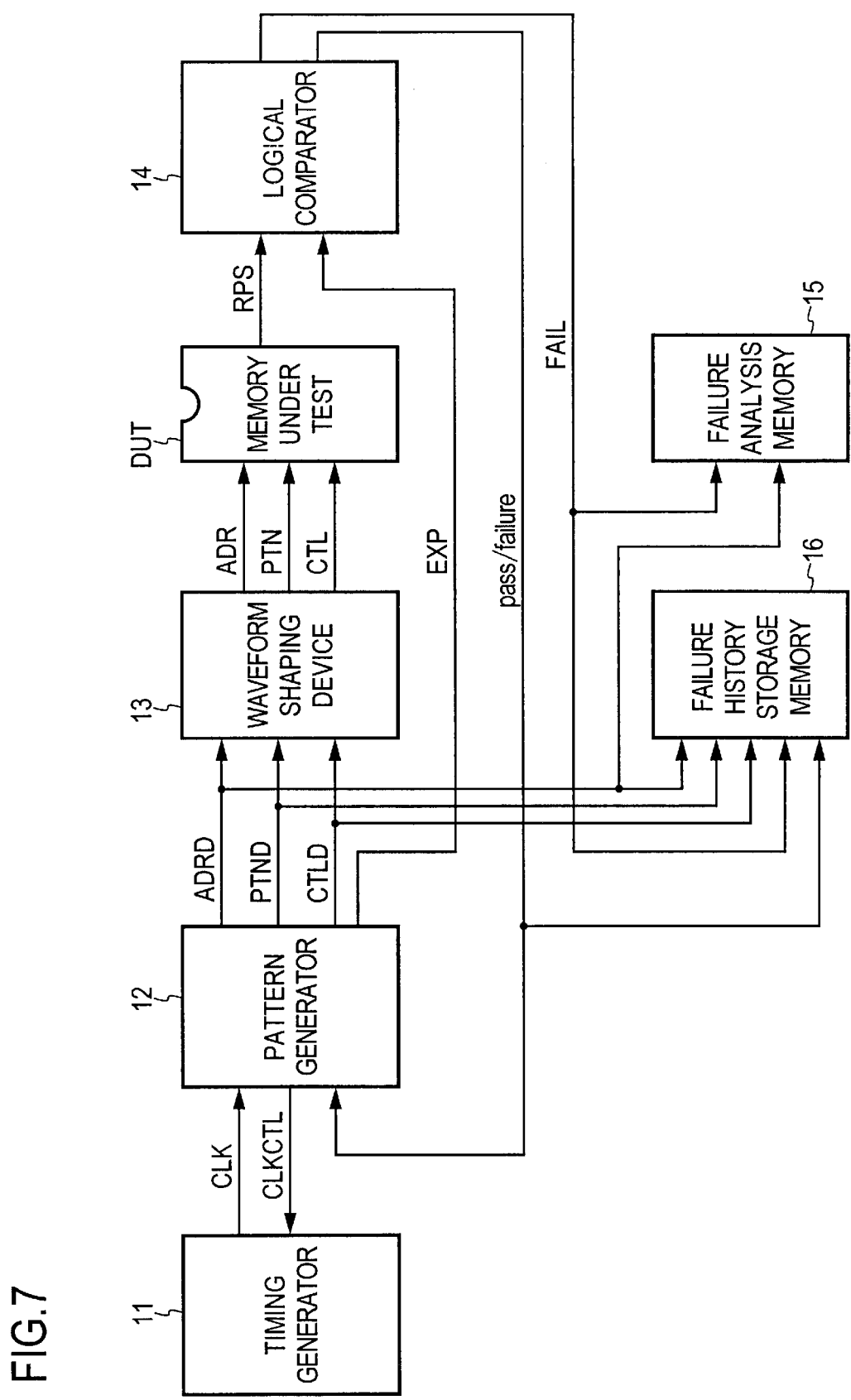
FIG. 7 is a block diagram showing an outline of the construction of a prior memory testing.

Accordingly, only when the first and second failure address storage memories 16A-1 and 16A-2 have been set in the writing mode, they store therein, if a failure memory cell is detected in the erase test, that is, when a decision result of failure "failure" is generated from the logical comparator 14 shown in FIG. 7 in the erase test, an address ADRD being generated from the pattern generator 12 shown in FIG. 2 at that time. As discussed above, since the first and second failure address storage memories 16A-1 and 16A-2 are alternately switched to the writing mode and the reading mode respectively by the mode switching controller 16G, if a failure memory cell is detected in the erase test, they will alternately store an address ADRD being generated from the pattern generator 12.

The first and second address selector circuits 16F-1 and 16F-2 have relation to the first and second failure address storage memories 16A-1 and 16A-2, respectively, and in this embodiment, it is constructed that when the control signal SEL given from the sequence controller 12D has a logical "0", the first address selector circuit 16F-1 selects the storage address selector circuit 16J thereby to give a storage address WADR to the first failure address storage memory 16A-1 as well as the second address selector circuit 16F-2 selects the read counter 16I thereby to give a reading address RADR to the second failure address storage memory 16A-2. In addition, it is constructed that when the control signal SEL has a logical "1", the first address selector circuit 16F-1 selects the read counter 16I thereby to give a reading address RADR to the first failure address storage memory 16A-1 as well as the second address selector circuit 16F-2 selects the storage address selector circuit 16J thereby to give a writing address WADR to the second failure address storage memory 16A-2.

The failure cell address selector circuit 16H is constructed in this embodiment such that it selects, when the control signal SEL given from the sequence controller 12D has a logical "0", the second failure address storage memory 16A-2 thereby to send failure addresses FCADR stored in the second failure address storage memory 16A-2 to the register 12A-1 of the pattern generator 12 one address by one address, and that it selects, when the control signal SEL has a logical "1", the first failure address storage memory 16A-1 thereby to send failure addresses FCADR stored in the first failure address storage memory 16A-1 to the register 12A-1 of the pattern generator 12 one address by one.

The read counter 16I is an increment counter in this embodiment, and is initialized to its count value "0" at the start of the test as well as when a counter clear signal RCLR is applied thereto from the sequence controller 12D. In addition, the read counter 16I increments its count value by +1 each time a counter increment signal RINC is applied thereto from the sequence controller 12D.

Further, as in the prior art, the fail pattern data storage memory 16B stores therein a test pattern data PTND being outputted from the pattern generator 12 if a failure memory cell has been detected in the erase test, that is, when a decision result of failure "failure" has been generated from the logical comparator 14. The fail control signal storage memory 16C stores therein a control signal CTLD being outputted from the pattern generator 12 when a failure memory cell has been detected in the erase test. The fail data storage memory 16D stores therein a failure data FAIL being generated from the logical comparator 14 when a failure memory cell has been detected in the erase test.

Next, in case the erase test for a non-volatile memory is carried out by using the memory testing apparatus provided with the pattern generator 12 and the failure history storage memory 16 thus constructed, the operation thereof will be described.

At the start of the erase test, the control signal SEL of logical "0" is generated from the sequence controller 12D so that the mode switching controller 16G sets the first failure address storage memory 16A-1 in the writing mode and the second failure address storage memory 16A-2 in the reading mode. In addition, the first storage address generating circuit 16E-1 comes to the state to generate a storage address WADR, and the storage address selector circuit 16J selects the first storage address generating circuit 16E-1. The first address selector circuit 16F-1 selects the storage address selector circuit 16J, and the second address selector circuit 16F-2 selects the read counter 16I. The failure cell address selector circuit 16H selects the second failure address storage memory 16A-2, and the loop number comparative selector circuit 16K selects the second storage address generating circuit 16E-2. The read counter 16I has its initial value "0" at the start of the test, as described above.

After an erasing pattern has been applied to a block to be tested in the memory under test DUT, the control signal ASEL of logical "0" is given to the selector circuit 12A-3 from the sequence controller 12D-1 so that the selector circuit 12A-3 selects the address generator 12A-1. In the first time erase test, as in the prior art, address signals are sequentially generated from the address generator 12A-1 provided in the pattern generator 12, for example, starting at the first column address CA (0) and the first row address RA (0) through CA and RA addresses (1, 0), (2, 0), (3, 0), . . . , to (7, 0) in the column address direction, proceeding to the second RA address (1), starting at the first CA (0) and the second RA (1) through CA and RA addresses (1, 1), (2, 1), (3, 1), . . . , to (7, 1) in the column address direction, proceeding to the third RA address (2), . . . , until the last CA and RA address (7, 7) in the same sequence, and thus, all addresses of the block to be tested in the non-volatile memory are generated. These addresses ADRD are sent through the selector circuit 12A-3 to the waveform shaping device 13 in which they are shaped into address signals ADR each having a real waveform, and then, they are applied to the memory under test DUT.

On the other hand, in the failure history storage memory 16, when the logical comparator 14 shown in FIG. 7 generates a decision result of failure "failure" showing that a response data signal RPS read out of the memory under test DUT does not coincide with an expected value pattern data EXP from the pattern data generating part 12C of the pattern generator 12, the first storage address generating circuit 16E-1 generates the first time storage address ("0" in this example), and thereafter, increments a storage address WADR to be generated therein by +1 each time a decision result of failure "failure" is generated. The storage address WADR from the first storage address generating circuit 16E-1 is sent through the storage address selector circuit 16J to the first and second address selector circuits 16F-1 and 16F-2. Since the second address selector circuit 16F-2 is supplied with the control signal SEL of logical "0" from the sequence controller 12D, the selector circuit 16F-2 selects the read counter 16I, and hence the storage address WADR is not inputted into the second address selector circuit 16F-2. The storage address WADR from the first storage address generating circuit 16E-1 is also inputted through the storage address selector circuit 16J into the fail pattern data storage memory 16B, the fail control signal storage memory 16C and the fail data storage memory 16D.

The first address selector circuit 16F-1 applies the storage address WADR sent from the storage address selector circuit 16J to the first failure address storage memory 16A-1. The first failure address storage memory 16A-1 stores, when a decision result of failure "failure" is applied thereto, an address ADRD being generated from the address generator 12A-1 at that time as a failure cell address FCADR. The state of stored failure cell addresses FCADR is shown in FIG. 4A.

FIG. 4A illustrates the respective storage states of the first failure address storage memory 16A-1 and the second failure address storage memory 16A-2 at the time point that the first time erase test has been completed. The storage state of the first failure address storage memory 16A-1 shown in FIG. 4A at the left side thereof corresponds to the CA and RA addresses of the failure cells shown in the result of the first time erase test for the non-volatile memory in FIG. 1A, and shows the state of failure cell that the CA and RA addresses of failure cells detected as a result of the first time erase test are stored at the CA and RA addresses (3, 0), (2, 1), (7, 2), (4, 3), (2, 4), (4, 6), and (7, 7) of the first failure address storage memory 16A-1, respectively. These CA and RA addresses (3, 0), (2, 1), (7, 2), (4, 3), (2, 4), (4, 6), and (7, 7) correspond to the storage addresses 0, 1, 2, 3, 4, 5, and 6 generated by the first storage address generating circuit 16E-1, respectively.

In case the first time erase test has been ended and a failure cell or cells have been detected as the result, the control signal SEL generated from the sequence controller 12D is inverted in its logical value so that the control signal SEL of logical "1" is generated. In addition, a counter clear signal RCLR is given to the read counter 16I from the sequence controller 12D so that it has the initial value "0". By this generation of the control signal SEL of logical "1", the mode switching controller 16G sets the first failure address storage memory 16A-1 in the reading mode and the second failure address storage memory 16A-2 in the writing mode. In addition, the second storage address generating circuit 16E-2 comes to the state to generate a storage address WADR, and the storage address selector circuit 16J selects the second storage address generating circuit 16E-2. The first storage address generating circuit 16E-1 holds the number of addresses generated therein (in this example, numerical value 7 since it has generated addresses seven times). The first address selector circuit 16F-1 selects the read counter 16I, and the second address selector circuit 16F-2 selects the storage address selector circuit 16J. The failure cell address selector circuit 16H selects the first failure address storage memory 16A-1, and the loop number comparative s selector circuit 16K selects the first storage address generating circuit 16E-1.

The second time erase test is started, and after an erasing pattern is applied again to the block to be tested in the memory under test DUT, the control signal ASEL of logical "1" from the sequence controller 12D is given to the selector circuit 12A-3 so that the selector circuit 12A-3 selects the register 12A-2 as well as outputs a read counter control signal RCTLD. By application of the read counter control signal RCTLD to the read counter 16I, the initial value "0" of the read counter 16I is applied to the first failure address storage memory 16A-1 as a reading address RADR through the first address selector circuit 16F-1. Since the first failure address storage memory 16A-1 is being switched to the reading mode, the failure cell address FCADR stored at the CA and RA address (3, 0) of the first failure address storage memory 16A-1 is read out from the first failure address storage memory 16A-1, the CA and RA address (3, 0) corresponding to the reading address 0 from the read counter 16I. This read-out failure cell address FCADR is sent through the failure cell address selector circuit 16H to the pattern generator 12 and stored in the register 12A-2.

The read-out failure cell address FCADR is applied from the register 12A-2 through the selector circuit 12A-3 to the memory under test DUT as an address signal ADR so that the CA and RA address (3, 0) of the memory under test DUT is read out. In case the logical comparator 14 shown in FIG. 7 generates a decision result of failure "failure" as the result of logical comparison, a failure cell address FCADR being outputted from the pattern generator 12 at that time is stored at the CA and RA address (3, 0) of the second failure address storage memory 16A-2 specified by the storage address "0" from the second storage address generating circuit 16E-2. In this example, since the response data signal RPS read out of the CA and RA address (3, 0) of the memory under test DUT becomes "pass", the failure cell address FCADR is not stored in the second failure address storage memory 16A-2, and the second storage address generating circuit 16E-2 does not generate the first storage address 0.

The loop number comparative data selector circuit 16K takes therein the number of occurrence of addresses (a numerical value) generated by the first storage address generating circuit 16E-1, and gives the number of occurrence of addresses to the subtracter 12D-4 of the pattern generator 12 as a loop number comparative data LCOMP. In the example shown in FIG. 4A, the first storage address generating circuit 16E-1 generates addresses seven times. Consequently, the numerical value "7" is sent to the subtracter 12D-4 which subtracts 1 (one) from the numerical value "7". As a result, the numerical value "6" is given to the loop number comparator circuit 12D-5 as a comparative data.

In the second time erase test, count of a loop instruction (instruction to loop addresses of detected failure cells) outputted from the loop number comparator circuit 12D-5 is started at "0", and hence the numerical value 7=1+6 that is the sum of this first loop instruction "1" and the comparative data "6" given from the subtracter 12D-4 becomes an actual number of occurrence of loop instructions (the number of occurrence of loop instructions will be hereinafter referred to as loop occurrence number) in the second time erase test. The loop number comparator circuit 12D-5 compares the comparative data "6" given from the subtracter 12D-4 with the loop occurrence number, and outputs a logical "0" representing the loop instruction as far as the loop occurrence number is smaller than the comparative data "6" and outputs a logical "1" representing a control condition to be carried out at the next time when the loop occurrence number becomes equal to the comparative data "6". Accordingly, in this example, the loop instruction is outputted seven times.

When the second time loop instruction is outputted, a counter increment signal RINC is applied to the read counter 16I which in turn increments the reading address RADR by +1, thereby to apply the reading address "1" to the first failure address storage memory 16A-1 through the first address selector circuit 16F-1. As a result, the failure cell address FCADR stored at the CA and RA address (2, 1) of the first failure address storage memory 16A-1 is read out from the first failure address storage memory 16A-1, the CA and RA address (2, 1) corresponding to the reading address "1" from the read counter 16I. This read-out failure cell address FCADR is sent through the failure cell address selector circuit 16H to the pattern generator 12 and stored in the register 12A-2. Hereafter, in the same manner, the CA and RA address (7, 2) corresponding to the reading address "2", the CA and RA address (4, 3) corresponding to the reading address "2", . . . , the CA and RA address (4, 6) corresponding to the reading address "5" are sequentially read out, and the logical decisions are sequentially rendered, and the loop instructions are sequentially outputted. When the seventh time loop instruction is outputted, the CA and RA address (7, 7) corresponding to the reading address "6" is read out, and the logical decision is rendered, and thus, the second time erase test ends.

As a result, in the second time erase test, only the failure cell addresses FCADR which have been detected in the first time erase test and stored one address by one address in the register 12A-2 of the pattern generator 12 are sequentially applied through the selector circuit 12A-3 to the memory under test DUT as address signals ADR. Therefore, only the CA and RA addresses (3, 0), (2, 1), (7, 2), (4, 3), (2, 4), (4, 6), and (7, 7) in the block to be tested in the memory under test DUT are accessed so that the erase test is carried out on only the memory cells that have been determined to be failure in the first time erase test.

In such manner, in the second time erase test, each time the logical comparator 14 shown in FIG. 7 generates a decision result of failure "failure" (except the first time generation of "failure"), the second storage address generating circuit 16E-2 increments the storage address WADR generated therein by +1. The second address selector circuit 16F-2 applies the storage address WADR sent from the storage address selector circuit 16J to the second failure address storage memory 16A-2. The second failure address storage memory 16A-2 stores, when the storage address WADR is applied thereto, a failure cell address FCADR being outputted from the register 12A-2 at that time at the address of the storage memory 16A-2 specified by this storage address WADR. The state of stored failure cell addresses FCADR is shown in FIG. 4B.

FIG. 4B illustrates the respective storage states of the first failure address storage memory 16A-1 and the second failure address storage memory 16A-2 at the time point that the second time erase test has been completed. The storage state of the second failure address storage memory 16A-2 shown in FIG. 4B at the right side thereof corresponds to the CA and RA addresses of the failure cells shown in the result of the second time erase test for the non-volatile memory in FIG. 1B, and shows the state of failure cell that the CA and RA addresses of failure cells detected as a result of the second time erase test are stored at the CA and RA addresses (7, 2), (4, 3), and (7, 7) of the second failure address storage memory 16A-2, respectively. These CA and RA addresses (7, 2), (4, 3), and (7, 7) correspond to the storage addresses 0, 1, and 2 generated by the second storage address generating circuit 16E-2, respectively. At this time point, the first storage address generating circuit 16E-1 holds the number of addresses "7" generated therein. From FIG. 4B, it is seen that by the second time erase test, a decision has been rendered that the storage data at the CA and RA addresses (3, 0), (2, 1), (2, 4), and (4, 6) in the block to be tested have been erased.

In the second time erase test, when the loop instruction is outputted seven times, the loop occurrence number becomes equal to the comparative data "6", and hence the control condition is transferred to a control condition to be performed at the next time.

The control condition to be performed at the next time is to perform the third time erase test because three failure cells have been detected in this example. Accordingly, the control signal SEL of logical "1" generated from the sequence controller 12D is again inverted in its logical value so that the control signal SEL of logical "0" is generated. In addition, a counter clear signal RCLR is given to the read counter 16I from the sequence controller 12D so that it has the initial value "0". By this generation of the control signal SEL of logical "0", the mode switching controller 16G sets the first failure address storage memory 16A-1 in the writing mode and the second failure address storage memory 16A-2 in the reading mode. When the first failure address storage memory 16A-1 is set in the writing mode, all of the storage data in the first failure address storage memory 16A-1 have been erased. In addition, the first storage address generating circuit 16E-1 comes to the state to generate a storage address WADR, and the storage address selector circuit 16J selects the first storage address generating circuit 16E-1. The first address selector circuit 16F-1 selects the storage address selector circuit 16J, and the second address selector circuit 16F-2 selects the read counter 16I. The failure cell address selector circuit 16H selects the second failure address storage memory 16A-2, and the loop number comparative selector circuit 16K selects the second storage address generating circuit 16E-2.

The third time erase test is started, and after an erasing pattern is applied again to the block to be tested in the memory under test DUT, the control signal ASEL of logical "1" from the sequence controller 12D is given to the selector circuit 12A-3 so that the selector circuit 12A-3 selects the register 12A-2 as well as outputs a read counter control signal RCTLD. By application of the read counter control signal RCTLD to the read counter 16I, the initial value "0" of the read counter 16I is applied to the second failure address storage memory 16A-2 as a reading address RADR through the second address selector circuit 16F-2. Since the second failure address storage memory 16A-2 is being switched to the reading mode, the failure cell address FCADR stored at the CA and RA address (7, 2) of the second failure address storage memory 16A-2 is read out from the second failure address storage memory 16A-2, the CA and RA address (7, 2) corresponding to the reading address 0 from the read counter 16I. This read-out failure cell address FCADR is sent through the failure cell address selector circuit 16H to the pattern generator 12 and stored in the register 12A-2.

The read-out failure cell address FCADR is applied from the register 12A-2 through the selector circuit 12A-3 to the memory under test DUT as an address signal ADR so that the CA and RA address (7, 2) of the memory under test DUT is read out. In case the logical comparator 14 shown in FIG. 7 generates a decision result of failure "failure", a failure cell address FCADR being outputted from the pattern generator 12 at that time is stored at the CA and RA address (7, 2) of the first failure address storage memory 16A-1 specified by the storage address "0" from the first storage address generating circuit 16E-1. In this example, since the response data signal RPS read out of the CA and RA address (7, 2) of the memory under test DUT becomes "pass", the failure cell address FCADR is not stored in the first failure address storage memory 16A-1, and the first storage address generating circuit 16E-1 does not generate the first storage address 0.

The loop number comparative data selector circuit 16K takes therein the number of occurrence of addresses (a numerical value) generated by the second storage address generating circuit 16E-2, and gives the number of occurrence of addresses to the subtracter 12D-4 of the pattern generator 12 as a loop number comparative data LCOMP. In the example shown in FIG. 4B, the second storage address generating circuit 16E-2 generates addresses three times. Consequently, the numerical value "3" is sent to the subtracter 12D-4 which subtracts 1 (one) from the numerical value "3". As a result, the numerical value "2" is given to the loop number comparator circuit 12D-5 as a comparative data.

In the third time erase test, too, count of a loop instruction outputted from the loop number comparator circuit 12D-5 is started at "0", and hence the numerical value 3=1+2 that is the sum of this first loop instruction "1" and the comparative data "2" given from the subtracter 12D-4 becomes an actual loop occurrence number in the third time erase test. The loop number comparator circuit 12D-5 compares the comparative data "3" given from the subtracter 12D-4 with the loop occurrence number, and outputs a logical "0" representing the loop instruction as far as the loop occurrence number is smaller than the comparative data "3" and outputs a logical "1" representing a control condition to be carried out at the next time when the loop occurrence number becomes equal to the comparative data "3". Accordingly, in this example, the loop instruction is outputted three times.

When the second time loop instruction is outputted, a counter increment signal RINC is applied to the read counter 16I which in turn increments the reading address RADR by +1, thereby to apply the reading address "1" to the second failure address storage memory 16A-2 through the second address selector circuit 16F-2. As a result, the failure cell address FCADR stored at the CA and RA address (4, 3) of the second failure address storage memory 16A-2 is read out from the second failure address storage memory 16A-2, the CA and RA address (4, 3) corresponding to the reading address "1" from the read counter 16I. This read-out failure cell address FCADR is sent through the failure cell address selector circuit 16H to the pattern generator 12 and stored in the register 12A-2. Hereafter, in the same manner of operation, the CA and RA address (7, 7) corresponding to the reading address "2" is read out, and the logical decision is rendered, and thus, the third time erase test ends.

As a result, in the third time erase test, only the failure cell addresses FCADR which have been detected in the second time erase test and stored one address by one address in the register 12A-2 of the pattern generator 12 are sequentially applied through the selector circuit 12A-3 to the memory under test DUT as address signals ADR. Therefore, only the CA and RA addresses (7, 2), (4, 3), and (7, 7) in the block to be tested in the memory under test DUT are accessed so that the erase test is carried out on only the memory cells that have been determined to be failure in the second time erase test.

In such manner, in the third time erase test, each time the logical comparator 14 shown in FIG. 7 generates a decision result of failure "failure" (except the first time generation of "failure"), the first storage address generating circuit 16E-1 increments the storage address WADR generated therein by +1. The first address selector circuit 16F-1 applies the storage address WADR sent from the storage address selector circuit 16J to the first failure address storage memory 16A-1. The first failure address storage memory 16A-1 stores, when the storage address WADR is applied thereto, a failure cell address FCADR being outputted from the register 12A-2 at that time at the address of the storage memory 16A-1 specified by this storage address WADR. The state of stored failure cell addresses FCADR is shown in FIG. 4C.

FIG. 4C illustrates the respective storage states of the first failure address storage memory 16A-1 and the second failure address storage memory 16A-2 at the time point that the third time erase test has been completed. The storage state of the first failure address storage memory 16A-1 shown in FIG. 4C at the left side thereof corresponds to the CA and RA addresses of the failure cells shown in the result of the third time erase test for the non-volatile memory in FIG. 1C, and shows the state of failure cell that the CA and RA address of a failure cell detected as a result of the third time erase test is stored at the CA and RA address (7, 7) of the first failure address storage memory 16A-1. This CA and RA address (7, 7) corresponds to the storage address 0 generated by the first storage address generating circuit 16E-1. At this time point, the second storage address generating circuit 16E-2 holds the number of addresses "3" generated therein. From FIG. 4C, it is seen that by the third time erase test, a decision has been rendered that the storage data at the CA and RA addresses (7, 2) and (4, 3) in the block to be tested have been erased.

In the third time erase test, when the loop instruction is outputted three times, the loop occurrence number becomes equal to the comparative data "3", and hence the control condition is transferred to a control condition to be performed at the next time.

The control condition to be performed at the next time is to perform the fourth time erase test because one failure cell has been detected in this example. Accordingly, the control signal SEL generated from the sequence controller 12D is again inverted in its logical value so that the control signal SEL of logical "1" is again generated. In addition, a counter clear signal RCLR is given to the read counter 16I from the sequence controller 12D so that it has the initial value "0". Further, the operation manner of the fourth erase test is approximately the same as that of the second time erase test except that the number of failure cells is one (1), and explanation thereof will be omitted. The above-mentioned erase test is carried out a prescribed number of times as far as a failure cell or cells are detected.

Figure 5:
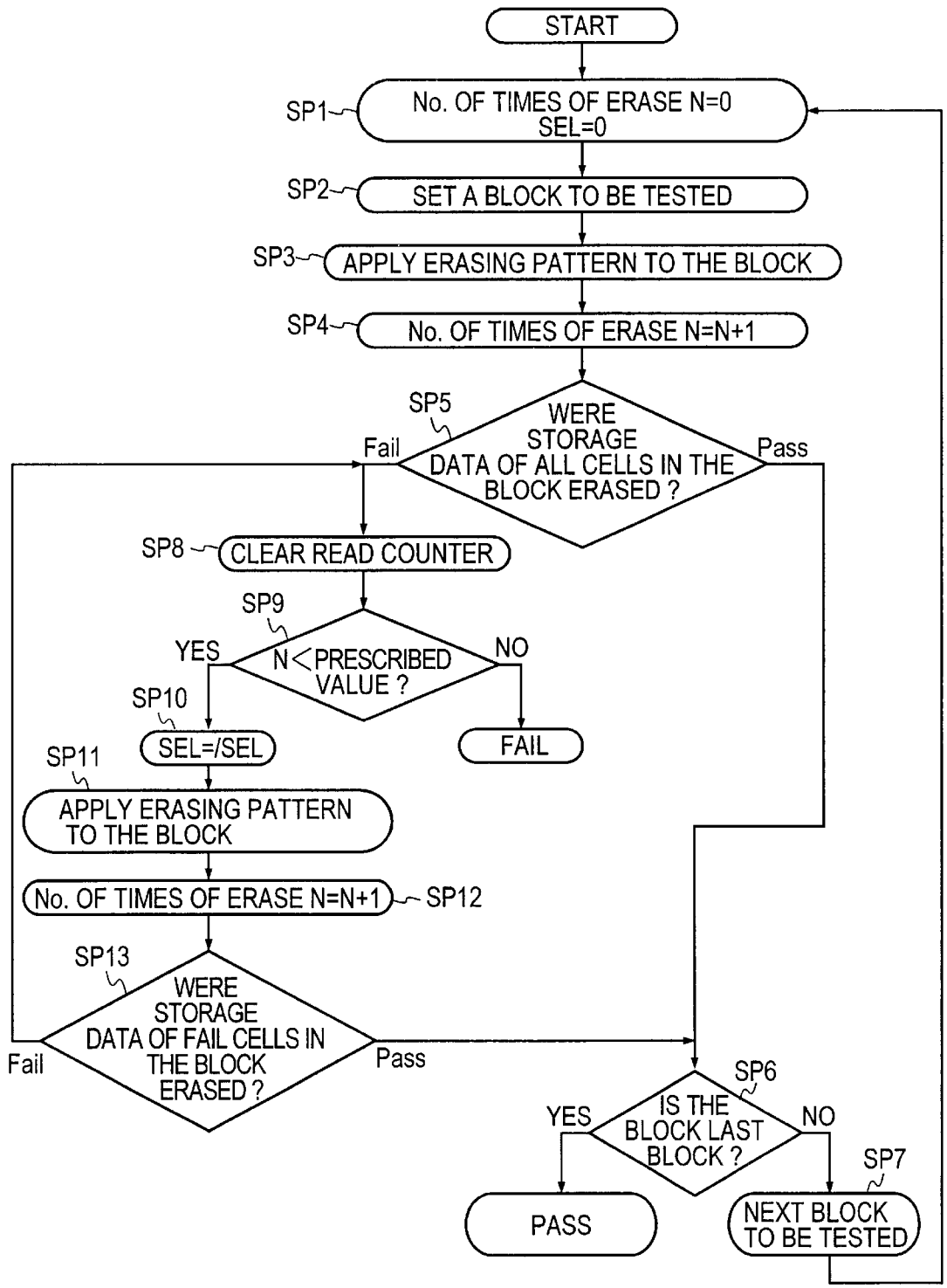
FIG. 5 is a flow chart for explaining the operation of one embodiment of the memory testing method according to the present invention.

FIG. 5 is a flow chart for explaining the above-mentioned erase test for a non-volatile memory in the sequence of process steps. First, in the first step SP1, the number of times of erases N is initialized to N=0, and the control signal SEL is set to logical "0". In the second step SP2, a block to be tested of the non-volatile memory under test is set, and in the third step SP3, an erasing pattern is applied to the set block to be tested, thereby to erase the storage data in each of all memory cells in the block to be tested (the first time erase). In the fourth step SP4, the number of times of erases N is incremented by +1 so that it becomes one time.

Next, in the fifth step SP5, all of the storage data in all memory cells in the block to be tested have been read out to inspect as to whether the storage data in each memory cell has been erased or not (the first time decision operation). In the fifth step SP5, if it is confirmed that all of the storage data in all memory cells in the block to be tested have been erased, the process is branched to good path "Pass" reaching the sixth step SP6. In the sixth step SP6, a decision is rendered as to whether the block to be tested is the last block or not. If it is determined that the block to be tested is the last block, the process is branched to YES path so that it is determined that the non-volatile memory under test is a good memory "PASS". On the other hand, in the sixth step SP6, if it is determined that the block to be tested is not the last block, the process is branched to NO path reaching the seventh step SP7. In the seventh step SP7, a process for proceeding to the next block to be tested (incrementing the block address by +1) is applied to the memory under test, and then the process returns back to the first step SP1.

In the fifth step SP5, if even one memory cell the storage data of which has been not erased (failure cell) has been detected, the process is branched to failure path "Fail" reaching the eighth step SP8. In the eighth step SP8, a read counter clear signal RCLR is generated thereby to initialize the read counter 16I to its initial value "0".

In the next ninth step SP9, a decision as to whether the number of erase times N is smaller than a prescribed value or not is rendered. If the number of erase times N is smaller than the prescribed value, then the process is branched to YES path proceeding to the tenth step SP10. In the tenth step SP10, the control signal SEL is inverted in its logical value.

In the next eleventh step SP11, an erasing pattern is again applied to the block to be tested, thereby to erase the storage data in each of all memory cells in the block to be tested (the second time erase). In the next twelfth step SP12, the number of times of erases N is incremented by +1 so that it becomes two times, and the process proceeds to the thirteenth step SP13.

In the thirteenth step SP13, only the storage data in the memory cells that have been determined to be failure in the preceding erase test, have been read out to inspect as to whether the storage data in each of the read-out memory cells has been erased or not (the second time decision operation). If it is confirmed that all of the storage data in all the read-out memory cells have been erased, the process is branched to good path "Pass" reaching the sixth step SP6. In the sixth step SP6, a decision is rendered as to whether the block to be tested is the last block or not. If it is determined that the block to be tested is the last block, the process is branched to YES path so that it is determined that the non-volatile memory under test is a good memory "PASS". On the other hand, in the sixth step SP6, if it is determined that the block to be tested is not the last block, the process is branched to NO path reaching the seventh step SP7. In the seventh step SP7, a process for proceeding to the next block to be tested is applied to the memory under test, and then the process returns back to the first step SP1.

In the thirteenth step SP13, if even one failure cell has been detected, the process is branched to failure path "Fail" returning back to the eighth step SP8. In the eighth step SP8, a read counter clear signal RCLR is again generated thereby to initialize the read counter 16I to its initial value "0".

In the next ninth step SP9, a decision as to whether the number of erase times N is smaller than a prescribed value or not is rendered. If the number of erase times N is smaller than the prescribed value, then, the process is branched to YES path proceeding to the tenth step SP10, and the third time erase test is performed. The operation manner of the third erase test is approximately the same as that of the second time erase test, and explanation thereof will be omitted. As far as a failure cell or cells are detected, a similar erase test is repetitively carried out until the number of erase times N becomes equal to the prescribed value.

In the ninth step SP9, if the number of erase times N exceeds the prescribed value, then the process is branched to NO path so that the block to be tested is determined to be failure "FAIL", and the erase test for this block to be tested is ended.

Figure 6:
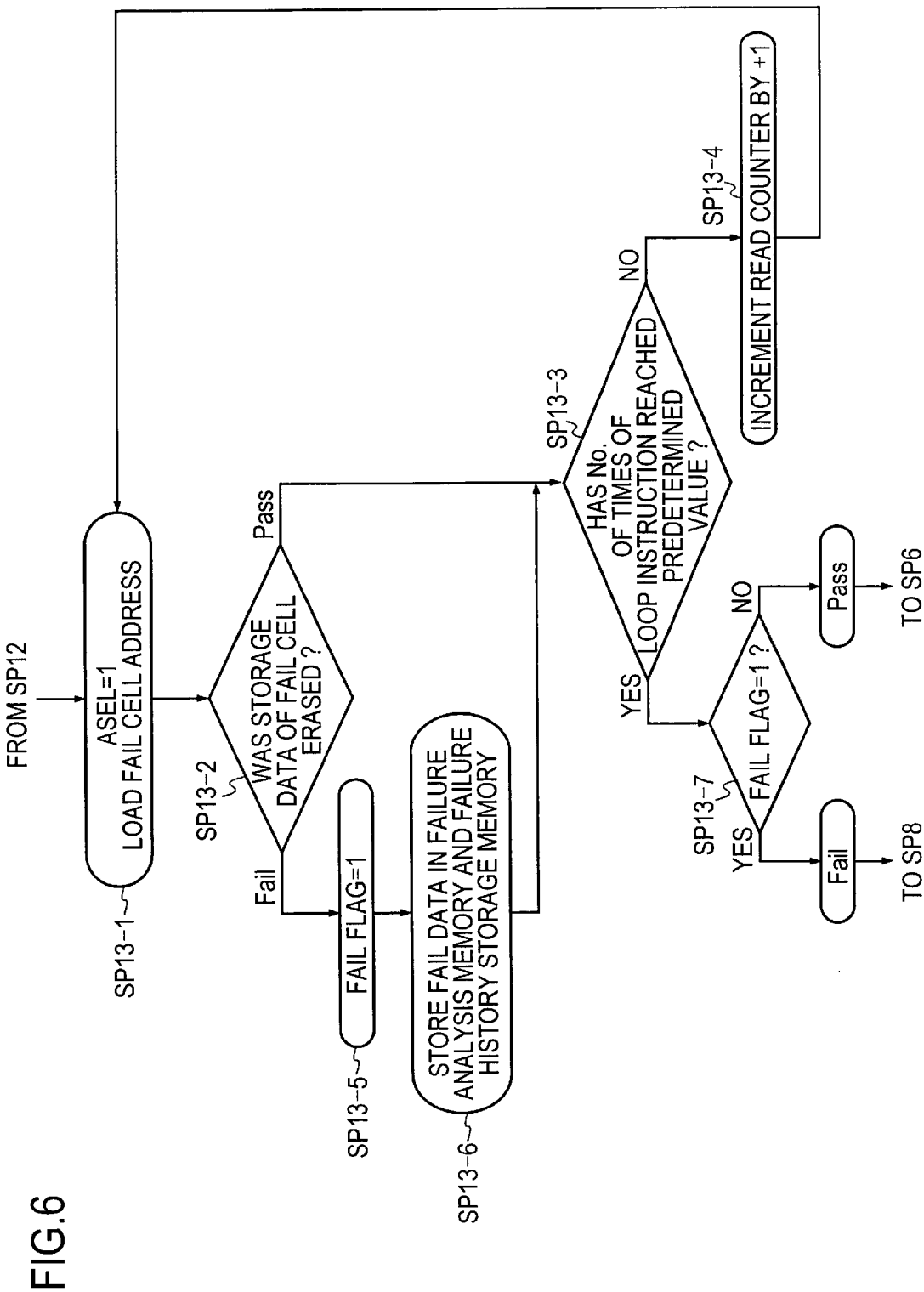
FIG. 6 is a flow chart for explaining in detail a portion of the flow chart shown in FIG. 5.

The details of the decision operations in the second time and the succeeding erase tests performed in the thirteen step SP13 will be described with reference to a flow chart shown in FIG. 6.

First, in a step SP13-1, the control signal ASEL is set in its logical value to logical "1", thereby to cause the selector circuit 12A-3 of the pattern generator 12 to select the register 12A-2 and to cause the read counter 16I to output the reading address 0 to load a failure cell address in the register 12A-2, the failure cell address being stored at the first address of the first or second failure address storage memory 16A-1 or 16A-2 (the failure address storage memory set in the reading mode).

In the next step SP13-2, the failure cell address loaded in the register 12A-2 is applied to the memory under test DUT, and thereafter, a response data signal RPS read out of the failure cell in the memory under test DUT is inspected as to whether the storage data in the failure cell has been erased or not. If it is determined to be "Pass" (the storage data in the failure cell has been erased), the process proceeds to a step SP13-3 where a decision is rendered as to whether the loop occurrence number has reached a predetermined value or not. In case the loop occurrence number is smaller than or equal to the predetermined value, the process is branched to NO path reaching a step SP13-4. In this step SP13-4, the count value of the read counter 16I is incremented by +1, and the process returns back to the step SP13-1.

In the step SP13-1, the next reading address 1 is outputted from the read counter 16I, thereby to load in the register 12A-2 the failure cell address stored at the next address of the failure address storage memory that has been set in the reading mode. In the next step SP13-2, a response data signal RPS read out of the failure cell in the memory under test DUT is inspected as to whether the storage data in the failure cell has been erased or not.

In the step SP13-2, if a decision is rendered that it is "Fail" (the failure cell the storage data of which has not erased), the process is branched to a step SP13-5 in which one (1) is set in a failure flag (fail flag=1). In the next step SP13-6, a failure data "FAIL" is stored in the failure analysis memory 15 and the failure history storage memory 16. In the failure history storage memory 16, the address of that failure cell is stored in either one of the first or second failure address storage memory 16A-1 or 16A-2 (the failure address storage memory that has been set in the writing mode). After the failure data has been stored, the process proceed to the step SP13-3.

In the step SP13-3, as described above, a decision is rendered as to whether the loop occurrence number has reached a predetermined value or not. In case the loop occurrence number is smaller than or equal to the predetermined value, the process proceeds to the step SP13-4. In the step SP13-4, the count value of the read counter 16I is incremented by +1, and the process returns back to the step SP13-1. In the step SP13-3, in case the loop occurrence number has reached the predetermined value, the process is branched to YES path, and proceeds to the next step SP13-7.

In the step SP13-7, a decision is rendered as to whether the failure flag has been 1 or not. In case the failure flag has not been 1 (NO), a decision is rendered that all of the read-out failure cells have been erased in their storage data, and the process is branched to good path "Pass" proceeding to the sixth step SP6 in FIG. 5. In the step SP13-7, in case the failure flag has been set to 1 (YES), a decision is rendered that there is still a failure cell or cells, the process is branched to failure path "Fail", and then, the process return back to the eighth step SP8 in FIG. 5.

As is apparent from the foregoing description, in accordance with the present invention, though all of the memory cells at all the addresses in a block to be tested have been inspected as to whether the storage data in each of the memory cells has been erased or not in the first time erase test, the second time and the succeeding erase tests are performed such that only memory cells that have been determined to be failure cells as a result of the preceding erase test, are inspected as to whether each of the storage data has been erased or not. Therefore, a time duration required to inspect the memory cells in the second time and the succeeding erase tests can be greatly reduced. As a result, a time duration required to test a non-volatile memory can be reduced, and there is obtained an advantage that a large number of non-volatile memories can be tested in a short time duration.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A memory testing method wherein after data has been written in all of the memory cells in one block to be tested of a memory having its storage area divided into a plurality of blocks, an erase test has been carried out which comprises the steps of: erasing en bloc the storage data written in all of the memory cells in the block to be tested; and inspecting as to whether the storage data in each of the memory cells has been erased or not, said method comprising the steps of:

in the first time erase test, sequentially reading out all of the memory cells in the block to be tested that have been erased en bloc, inspecting as to whether the storage data in each of the memory cells has been erased or not, and storing, when a failure memory cell the storage data of which has not been erased has been detected, the address of the failure memory cell; and in the second time and the succeeding erase tests in case a failure memory cell or cells have been detected, reading out only the failure memory cell or cells in the block to be tested, the address or addresses of the failure memory cell or cells having been stored, and inspecting as to whether the storage data in the failure memory cell or each of the failure memory cells has been erased or not.

2. The memory testing method as set forth in claim 1, further comprising the step of determining, in case no failure memory cell has detected from the block to be tested by carrying out the erase test a plurality of times smaller than or equal to a prescribed number of times, the block to be tested to be one which has no failure memory cell, and determining, in case a failure memory cell has been detected from the block to be tested by carrying out the erase test repetitively even the prescribed number of times, the block to be tested to be failure.

3. The memory testing method as set forth in claim 1 or 2, further comprising the step of rendering a decision as to whether the block to be tested that has been determined to have no failure memory cell is the last block or not, and when the block to be tested is not the last block, carrying out the erase test for the next block, and when the block to be tested is the last block, rendering a decision that the memory is pass.

4. A memory testing apparatus comprising:

an address generator generating block addresses each specifying each block of a memory under test having its storage area divided into a plurality of blocks, and all addresses of the memory cells in each block;

a first failure address storage memory storing, each time a failure memory cell the storage data of which has not been erased is detected, during a erase test inspecting as to whether the storage data in each of the memory cells in a block to be tested specified by a block address generated from said address generator has been erased or not, the address of the failure memory cell, the stored failure memory cell address or addresses being read out from said first failure address storage memory in case the next erase test is carried out;

a second failure address storage memory storing, each time a failure memory cell the storage data of which has not been erased is detected, during the erase test is being carried out by reading out the failure memory cell or cells stored in said first failure address storage memory, the address of the failure memory cell, the stored failure memory cell address or addresses being read out from said second failure address storage memory in case the next erase test is carried out;

controller alternately switching said first failure address storage memory and said second failure address storage memory to the writing mode and the reading mode;

counting means counting the number of times of data erases performed for the block to be tested; and pass/failure decision means comparing the count value counted by said counting means with a predetermined set value, and rendering a decision as to whether the data in all of the memory cells in the block to be tested have been erased or not within a predetermined number of erase times.

5. The memory testing apparatus as set forth in claim 4, further comprising:

a first storage address generating circuit applying a storage address to the first failure address storage memory set in the writing mode, said storage address specifying an address of the first failure address storage memory at which the address of the detected failure memory cell is stored;

a second storage address generating circuit applying a storage address to the second failure address storage memory set in the writing mode, said storage address specifying an address of the second failure address storage memory at which the address of the detected failure memory cell is stored; and a read counter applying a reading address to the first failure address storage memory set in the reading mode or the second failure address storage memory set in the reading mode, said reading address specifying the address of the first failure address storage memory or the second failure address storage memory, at which the address of the failure memory cell is stored.

6. The memory testing apparatus as set forth in claim 4 or 5, further comprising:

a memory means temporarily storing the address of the failure memory cell read out from the first failure address storage memory set in the reading mode or the second failure address storage memory set in the reading mode.

* * * * *